United States Patent
Mizuhara et al.

(10) Patent No.: US 8,709,923 B2
(45) Date of Patent: Apr. 29, 2014

(54) METHOD OF MANUFACTURING III-NITRIDE CRYSTAL

(71) Applicant: Sumitomo Electric Industries, Ltd., Osaka (JP)

(72) Inventors: Naho Mizuhara, Itami (JP); Koji Uematsu, Itami (JP); Michimasa Miyanaga, Itami (JP); Keisuke Tanizaki, Itami (JP); Hideaki Nakahata, Itami (JP); Seiji Nakahata, Itami (JP); Takuji Okahisa, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/762,401

(22) Filed: Feb. 8, 2013

(65) Prior Publication Data
US 2013/0160699 A1 Jun. 27, 2013

Related U.S. Application Data

(63) Continuation of application No. 13/564,731, filed on Aug. 2, 2012, now Pat. No. 8,404,042, which is a continuation-in-part of application No. 12/467,297, filed on May 17, 2009, now Pat. No. 8,258,051, which is a continuation-in-part of application No. PCT/JP2007/072096, filed on Nov. 14, 2007.

(30) Foreign Application Priority Data

Nov. 17, 2006 (JP) .................................. 2006-311622
Oct. 2, 2007 (JP) .................................. 2007-258567

(51) Int. Cl.
 H01L 21/20 (2006.01)
 C30B 19/12 (2006.01)
 C30B 25/18 (2006.01)

(52) U.S. Cl.
 USPC ................. 438/503; 117/58; 117/63; 117/94; 117/95; 117/101; 117/952; 257/615; 257/627; 257/628; 257/E21.108; 257/E21.109; 257/E21.117; 257/E21.119; 257/E29.089; 257/E33.005; 438/46

(58) Field of Classification Search
 USPC ............ 438/492, 503, 46; 117/58, 63, 94, 95, 117/101, 952; 257/615, 627, 628, E21.108, 257/E21.109, E21.117, E21.119, E29.089, 257/E33.005
 See application file for complete search history.

(56) References Cited

U.S. PATENT DOCUMENTS 5,127,983 A * 7/1992 Imai et al. ........................ 117/85
5,443,032 A * 8/1995 Vichr et al. ...................... 117/84
(Continued)

FOREIGN PATENT DOCUMENTS

EP  2 083 099 A1 * 7/2009 ............ H01L 21/205
JP  H03-075298 A * 3/1991 .............. C30B 29/04
(Continued)

Primary Examiner — Mary Wilczewski
(74) Attorney, Agent, or Firm — James W. Judge

(57) ABSTRACT

Provided is a method of manufacturing III-nitride crystal having a major surface of plane orientation other than {0001}, designated by choice, the III-nitride crystal manufacturing method including: a step of slicing III-nitride bulk crystal through a plurality of planes defining a predetermined slice thickness in the direction of the designated plane orientation, to produce a plurality of III-nitride crystal substrates having a major surface of the designated plane orientation; a step of disposing the substrates adjoining each other sideways in a manner such that the major surfaces of the substrates parallel each other and such that any difference in slice thickness between two adjoining III-nitride crystal substrates is not greater than 0.1 mm; and a step of growing III-nitride crystal onto the major surfaces of the substrates.

6 Claims, 25 Drawing Sheets

(56) References Cited

U.S. PATENT DOCUMENTS

| | | | |
|---|---|---|---|
| 5,474,021 A * | 12/1995 | Tsuno et al. | 117/97 |
| 5,704,985 A * | 1/1998 | Kordina et al. | 118/725 |
| 6,306,211 B1 * | 10/2001 | Takahashi et al. | 117/86 |
| 6,348,096 B1 * | 2/2002 | Sunakawa et al. | 117/88 |
| 6,468,347 B1 * | 10/2002 | Motoki et al. | 117/89 |
| 6,468,882 B2 * | 10/2002 | Motoki et al. | 438/460 |
| 6,982,435 B2 * | 1/2006 | Shibata et al. | 257/76 |
| 7,192,482 B2 * | 3/2007 | Mueller et al. | 117/84 |
| 7,727,874 B2 * | 6/2010 | Hanser et al. | 438/604 |
| 7,964,477 B2 * | 6/2011 | Fujiwara | 438/478 |
| 7,998,847 B2 * | 8/2011 | Hirota et al. | 438/493 |
| 8,002,892 B2 * | 8/2011 | Hirota et al. | 117/84 |
| 8,258,051 B2 * | 9/2012 | Mizuhara et al. | 438/503 |
| 8,269,251 B2 * | 9/2012 | Fujito et al. | 257/103 |
| 8,524,575 B2 * | 9/2013 | Uematsu et al. | 438/460 |
| 8,598,685 B2 * | 12/2013 | Fujiwara et al. | 257/615 |
| 2003/0207125 A1 * | 11/2003 | Sunakawa et al. | 428/428 |
| 2005/0164418 A1 * | 7/2005 | Goto et al. | 438/39 |
| 2005/0274976 A1 * | 12/2005 | Shibata | 257/189 |
| 2006/0189019 A1 * | 8/2006 | Lee et al. | 438/47 |
| 2007/0125996 A1 * | 6/2007 | Morita et al. | 257/11 |
| 2009/0026417 A1 * | 1/2009 | Fujita | 252/301.4 R |
| 2009/0081857 A1 * | 3/2009 | Hanser et al. | 438/507 |
| 2009/0236694 A1 * | 9/2009 | Mizuhara et al. | 257/615 |
| 2009/0278125 A1 * | 11/2009 | Duan et al. | 257/49 |
| 2009/0298265 A1 * | 12/2009 | Fujiwara | 438/478 |
| 2010/0148212 A1 * | 6/2010 | Fujito et al. | 257/103 |
| 2010/0189981 A1 * | 7/2010 | Poblenz et al. | 428/220 |
| 2010/0213576 A1 * | 8/2010 | Hiranaka et al. | 257/615 |
| 2011/0075695 A1 * | 3/2011 | Yoshizumi et al. | 372/45.011 |
| 2011/0110840 A1 * | 5/2011 | Miyanaga et al. | 423/409 |

FOREIGN PATENT DOCUMENTS

| | | | | |
|---|---|---|---|---|
| JP | 2001-102307 A * | 4/2001 | | H01L 21/205 |
| JP | 2002-029897 A * | 1/2002 | | C30B 29/38 |
| JP | 2005-162526 A * | 6/2005 | | C30B 29/38 |
| JP | 2005-343713 A * | 12/2005 | | C30B 29/38 |
| JP | 2006-027976 A * | 2/2006 | | C30B 29/38 |
| JP | 2006-315947 A * | 11/2006 | | C30B 29/38 |

* cited by examiner (1-100)  (1-101)  (1-102)  (1-103)

(11-20)  (11-21)  (11-22)  (11-23)

METHOD OF MANUFACTURING III-NITRIDE CRYSTAL

BACKGROUND OF THE INVENTION

1. Technical Field

The present invention, involving Group-III nitride crystal manufacturing methods, relates to a method of manufacturing III-nitride crystal having a major surface of plane orientation other than {0001}, designated by choice, and to semiconductor devices utilizing the crystal.

2. Description of the Related Art

Group-III nitride crystals, which are employed advantageously in semiconductor electronic devices including light-emitting devices and semiconductor sensors, are ordinarily manufactured by growing crystal onto the major surface of a sapphire substrate having a (0001) plane major surface, or onto a GaAs substrate having a (111) A-plane major surface, by means of a vapor-phase technique such as hydride vapor-phase epitaxy (HVPE) or metalorganic chemical vapor deposition (MOCVD), or by flux growth or other liquid-phase technique. Consequently, ordinarily obtained III-nitride crystals have a major surface whose plane orientation is {0001}.

With light-emitting devices on substrates that are III-nitride crystal having a major surface whose plane orientation is {0001}, and in which a multiquantum-well (MQW) structure as a light-emitting layer has been deposited on the major surface, the light-emission efficiency is decreased by spontaneous polarization that occurs within the light-emitting layer owing to the III-nitride crystal's <0001> oriented polarity. Consequently, the manufacture of III-nitride crystal having a major surface whose plane orientation is other than {0001} is being sought.

Reference is made, for example, to Japanese Unexamined Pat. App. Pub. No. 2005-162526: The following method has been proposed as way of preparing gallium-nitride crystal having a surface plane orientation of choice, without influencing the plane orientation of the major surface of the substrate. Namely, according to the method disclosed in Pat. App. Pub. No. 2005-162526, a number of rectangular crystal masses are diced from GaN crystal grown by vapor deposition. Meanwhile, a silicon oxide film is coated onto the surface of a separately readied sapphire substrate, and subsequently a number of recesses reaching to the substrate are formed in the film. Next, the numerous crystal masses are embedded into the recesses in a manner such that their top surfaces will have the same plane orientation. Then, by vapor deposition with the crystal masses as seeds, gallium nitride crystal having a surface plane orientation of choice is grown.

BRIEF SUMMARY OF THE INVENTION

With the method in Pat. App. Pub. No. 2005-162526, however, inasmuch as growth of the GaN crystal is carried out with, as seeds, the masses of crystal GaN that have been embedded into the sapphire substrate, due to the disparity in thermal expansion coefficient between sapphire and GaN, fractures and strains appear in the GaN crystal when the crystal is cooled following the growth process, such that GaN crystal of superior crystallinity has not been obtainable.

Furthermore, if III-nitride crystal containing Al—for example, $Al_xGa_yIn_{1-x-y}N$ (x>0, y≥0, x+y≤1)—is grown by the method in Pat. App. Pub. No. 2005-162526, because the Al precursor is not selective with respect to the silicon oxide film, the $Al_xGa_yIn_{1-x-y}N$ grows onto the silicon oxide film as well, and consequently $Al_xGa_yIn_{1-x-y}N$ crystal of superior crystallinity has not been obtainable.

An object of the present invention, to resolve the problems discussed above, is to make available a method of manufacturing III-nitride crystal of superior crystallinity, having a major surface of plane orientation other than {0001}, designated by choice, and to make available semiconductor devices, utilizing III-nitride crystal obtained by the manufacturing method, that excel in light-emission efficiency.

In accordance with an embodiment of the present invention, provided is a method of manufacturing III-nitride crystal having a major surface of plane orientation other than {0001}, designated by choice, the III-nitride crystal manufacturing method including: a step of slicing III-nitride bulk crystal through a plurality of planes defining a predetermined slice thickness in the direction of the designated plane orientation, to produce a plurality of III-nitride crystal substrates having a major surface of the designated plane orientation; a step of disposing the substrates adjoining each other sideways in a manner such that the major surfaces of the substrates parallel each other and such that any difference in slice thickness between two adjoining III-nitride crystal substrates is not greater than 0.1 mm; and a step of growing III-nitride crystal onto the major surfaces of the substrates.

In accordance with another embodiment of the present invention, the designated plane orientation is misoriented by an off angle of 5° or less with respect to any crystallographically equivalent plane orientation selected from the group consisting of {1-10x} (wherein x is a whole number), {11-2y} (wherein y is a whole number), and {hk-(h+k)l} (wherein h, k and l are whole numbers).

In accordance with another embodiment of the present invention, the designated plane orientation is misoriented by an off angle of 5° or less with respect to {1-100} plane orientations.

In accordance with another embodiment of the present invention, the designated plane orientation is misoriented by an off angle of 5° or less with respect to any crystallographically equivalent plane orientation selected from the group consisting of {11-20}, {1-10±2}, {11-2±2}, {20-2±1} and {22-4±1}.

In accordance with another embodiment of the present invention, the roughness average Ra of the faces along which the substrates adjoin each other is 50 nm or less.

In accordance with another embodiment of the present invention, provided is the method further comprising a step of grinding/polishing the plurality of III-nitride crystal substrates such that the surface roughness of the substrate major surfaces is not greater than 50 nm.

LEGEND

1: III-nitride bulk crystal
10$p$, 10$q$: III-nitride crystal substrates
10$pm$, 10$qm$, 20$m$: major surfaces
10$pt$, 10$qt$: adjoining faces
20: III-nitride crystal
20$f$: facet
20$s$: direct-over-substrate region
20$t$: adjoining-substrate supra-region
20$v$: pit
21: III-nitride wafer
90: undersubstrate
91: mask
91$w$: window

DETAILED DESCRIPTION OF THE INVENTION

In crystallography, in order to represent the plane orientation of crystal faces, notation (Miller notation) such as (hkl) and (hkil) is used. The plane orientation of crystal faces in crystals of the hexagonal crystal system, such as III-nitride crystal, is expressed by (hkil). Herein, h, k, i and l are whole numbers referred to as Miller indices, where the relationship i=−(h+k) holds. The plane of the plane orientation (hkil) is called the (hkil) plane. And the direction perpendicular to the (hkil) plane (the direction of a line normal to the (hkil) plane) is called the [hkil] direction. Meanwhile, "{hkil}" generically signifies plane orientations comprehending (hkil) as well as each of its crystallographically equivalent orientations, and "<hkil>" generically signifies directions comprehending [hkil] as well as each of its crystallographically equivalent directions.

Figure 1A:
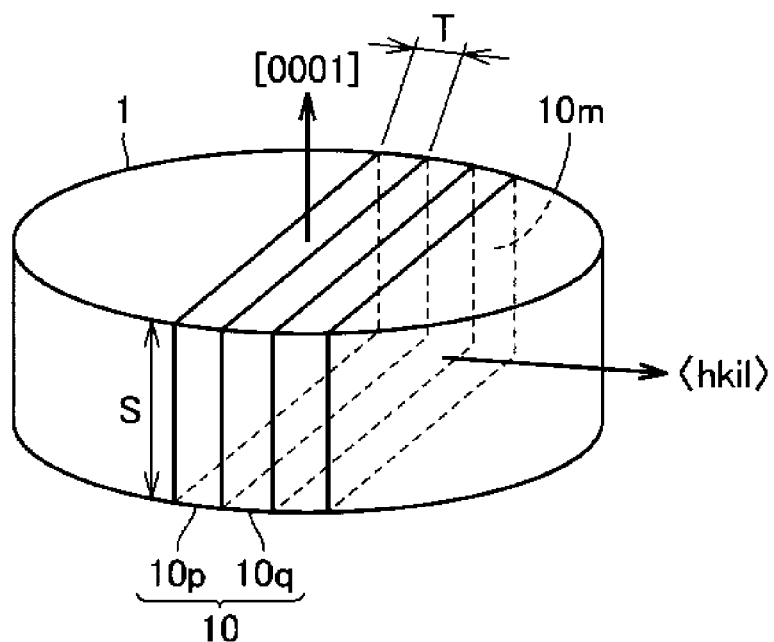
FIG. 1A, a schematic diagram for illustrating one mode of embodying a III-nitride crystal manufacturing method involving the present invention, is an oblique perspective view summarily representing a process step of slicing off substrates.
Figure 1B:
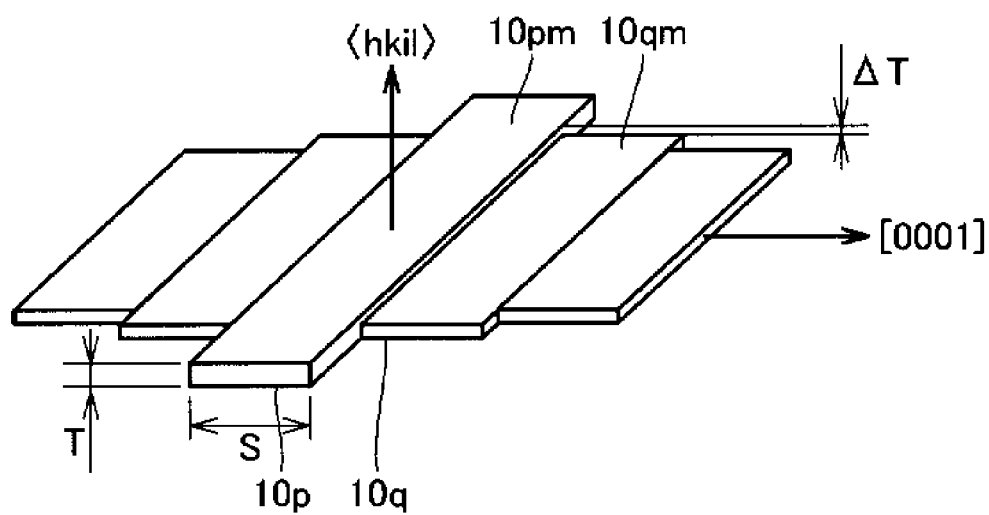
FIG. 1B, a schematic diagram for illustrating one mode of embodying a III-nitride crystal manufacturing method involving the present invention, is an oblique perspective view summarily representing a process step of arranging substrates into a row.
Figure 1C:
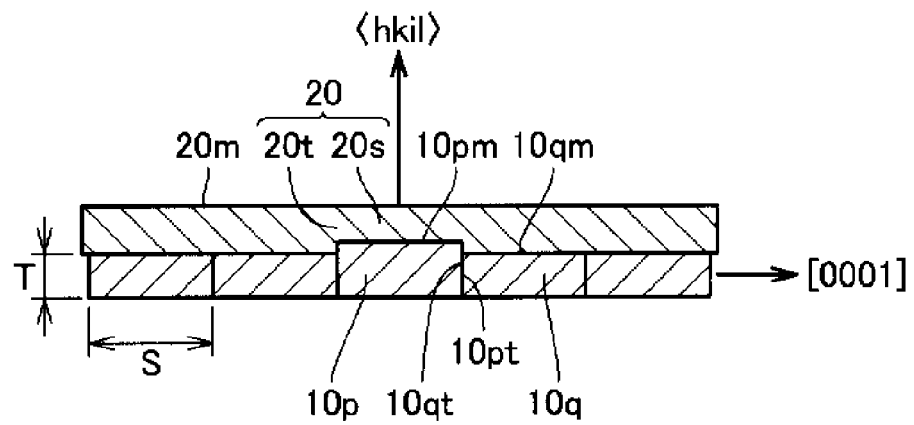
FIG. 1C, a schematic diagram for illustrating one mode of embodying a III-nitride crystal manufacturing method involving the present invention, is a sectional view summarily representing a crystal-growth process step.

One mode of embodying a III-nitride crystal manufacturing method involving the present invention is a method, with reference to FIG. 1, of manufacturing a III-nitride crystal 20 having a major surface 20$m$ of plane orientation {h$_0$k$_0$i$_0$l$_0$} other than {0001}, designated by choice, and includes the following steps. The first step is, as indicated in FIG. 1A, a step of slicing (which will also be termed a "slice-off substrates step" hereinafter) III-nitride bulk crystal 1 into a plurality of III-nitride crystal substrates 10$p$, 10$q$ having {h$_0$k$_0$i$_0$l$_0$} major surfaces 10$pm$, 10$qm$. The second step is, as indicated in FIG. 1B, a step of disposing (which will also be termed a "substrate placement step" hereinafter) the substrates 10$p$, 10$q$ adjoining each other sideways in such a way that the major surfaces 10$pm$, 10$qm$ of the plurality of III-nitride crystal substrates 10$p$, 10$q$ parallel each other and so that the [0001] directions in the substrates 10$p$, 10$q$ are oriented in the same way. The third step is, as indicated in FIG. 1C, a step of growing (which will also be termed a "crystal growth step" hereinafter) III-nitride crystal 20 onto the major surfaces 10$pm$, 10$qm$ of the plurality of III-nitride crystal substrates 10$p$, 10$q$.

In the first step (the slice-off substrates step) in the present embodying mode, a plurality of III-nitride crystal substrates 10$p$, 10$q$ having {h$_0$k$_0$i$_0$l$_0$} major surfaces 10$pm$, 10$qm$ is sliced from III-nitride bulk crystal 1.

The III-nitride bulk crystal 1 utilized in this first step is not particularly limited; crystal manufactured by ordinary methods—that is, growing crystal by HVPE, MOCVD, or other vapor deposition technique, or by flux growth or other liquid-phase technique, onto the major surface of, for example, a sapphire substrate having a (0001) major surface or a GaAs substrate having a (111) A-plane major surface—is adequate. Accordingly, although the III-nitride bulk crystal is not particularly limited, ordinarily it has a {0001} major surface. Here, from the perspective of diminishing dislocation density and enhancing crystallinity, it is preferable that the III-nitride bulk crystal 1 be grown, as is disclosed in Japanese Unexamined Pat. App. Pub. No. 2001-102307, by a facet growth technique characterized in that facets are formed on the surface where the crystal grows (the crystal growth face), and crystal growth is carried out without filling in the facets.

Likewise, there are no particular limitations on the method whereby the plurality of III-nitride crystal substrates 10$p$, 10$q$ having {h$_0$k$_0$i$_0$l$_0$} major surfaces 10$pm$, 10$qm$ is sliced from the III-nitride bulk crystal 1; as indicated in FIG. 1A, the III-nitride bulk crystal 1 can be cut through a plurality of planes having a predetermined perpendicular spacing along an <hkil> direction (the plane orientation of these planes being {hkil}, they are also referred to as {hkil} planes, as they will be hereinafter).

In the second step (the substrate placement step) in the present embodying mode, as indicated in FIG. 1B, the plural sliced-off III-nitride crystal substrates 10$p$, 10$q$ are disposed adjoining each other sideways in a manner such that the major surfaces 10$pm$, 10$qm$ of the substrates 10$p$, 10$q$ parallel each other and such that the [0001] directions in the substrates 10$p$, 10$q$ are oriented in the same way. In this case, while two adjoining III-nitride crystal substrates 10$p$, 10$q$ among the plurality of III-nitride crystal substrates have been labeled with reference marks in FIG. 1B, the situation is the same with the other adjoining III-nitride crystal substrates.

The plural III-nitride crystal substrates 10$p$, 10$q$ are disposed sideways so that the major surfaces 10$pm$, 10$qm$ of the substrates 10_p_, 10_q_ parallel each other, because if the angles formed by the major surfaces of the substrates and their crystal axes are not uniform along the substrates' major surface, the chemical composition of the III-nitride crystal grown onto the major surfaces of the substrates will be non-uniform along a plane parallel to the substrates' major surface. It is sufficient that the major surfaces 10_pm_, 10_qm_ of the substrates 10_p_, 10_q_ be parallel to each other; they need not necessarily be flush with each other. Nevertheless, the difference in height ΔT between the major surfaces 10_pm_, 10_qm_ of two adjoining III-nitride crystal substrates 10_p_, 10_q_ is preferably 0.1 mm or less, more preferably 0.01 mm or less.

Furthermore, from the perspective of designing for more uniform crystal growth by making the crystal orientations of the plural III-nitride crystal substrates 10_p_, 10_q_ the same, the substrates 10_p_, 10_q_ are disposed sideways in a manner such that the [0001] directions of the substrates 10_p_, 10_q_ are oriented in the same way. And the plural III-nitride crystal substrates 10_p_, 10_q_ are disposed adjoining each other because if there are gaps between substrates, the crystallinity of crystal that grows over the gaps would be compromised.

Reference is made to FIGS. 1A and 1B: By the first step (the slice-off substrates step) and the second step (the substrate placement step), from III-nitride bulk crystal 1 a plurality of III-nitride crystal substrates 10_p_, 10_q_ having $\{h_0k_0i_0l_0\}$ major surfaces 10_pm_, 10_qm_—disposed side-by-side in a manner such that the major surfaces 10_pm_, 10_qm_ of the plurality of III-nitride crystal substrates 10_p_, 10_q_ are parallel to each other and the [0001] directions in the substrates 10_p_, 10_q_ are oriented in the same way—is obtained.

In the third step (crystal growth step) in the present embodying mode, III-nitride crystal 20 is grown onto the major surfaces 10_pm_, 10_qm_ of the plurality of III-nitride crystal substrates 10_p_, 10_q_. In this case, growth of the III-nitride crystal 20 is epitaxial growth. Inasmuch as the major surfaces 10_pm_, 10_qm_ of the plurality of III-nitride crystal substrates 10_p_, 10_q_ have $\{h_0k_0i_0l_0\}$ plane orientation, the major surface 20_m_ of the III-nitride crystal 20 epitaxially grown onto the major surfaces 10_pm_, 10_qm_ has the same plane orientation $\{h_0k_0i_0l_0\}$ as the major surfaces 10_pm_, 10_qm_ of the plurality of III-nitride crystal substrates 10_p_, 10_q_. Again, inasmuch as III-nitride crystal 20 is grown onto the major surfaces 10_pm_, 10_qm_ of the plurality of III-nitride crystal substrates 10_p_, 10_q_, the difference in thermal expansion coefficient between the substrates 10_p_, 10_q_ and the III-nitride crystal 20 that is grown is slight, thanks to which fractures and strains are unlikely to appear in the grown crystal during post-crystal-growth cooling, yielding III-nitride crystal of superior crystallinity. From such viewpoints, it is preferable that the plurality of III-nitride crystal substrates 10_p_, 10_q_ and the III-nitride crystal 20 that is grown be of the same chemical composition. Making that the case enables III-nitride crystal 20 of superior crystallinity, having a $\{h_0k_0i_0l_0\}$ major surface 20_m_, to be manufactured.

In a III-nitride crystal manufacturing method in the present embodying mode, the aforementioned $\{h_0k_0i_0l_0\}$ preferably is any crystallographically equivalent plane orientation selected from the group consisting of $\{1\text{-}10x\}$ (wherein x is a whole number), $\{11\text{-}2y\}$ (wherein y is a whole number), and $\{hk\text{-}(h+k)l\}$ (wherein h, k and l are whole numbers). In III-nitride crystal thus conditioned, a face having any of the plane orientations $\{1\text{-}10x\}$, $\{11\text{-}2y\}$, or $\{hk\text{-}(h+k)l\}$ is a stable face, and therefore, III-nitride crystal of superior crystallinity can be grown stably onto a major surface having such plane orientation.

Again $\{h_0k_0i_0l_0\}$ may be, if not any crystallographically equivalent plane orientation selected from the group consisting of $\{1\text{-}10x\}$, $\{11\text{-}2y\}$, and $\{hk\text{-}(h+k)l\}$, then off-axis by an angle of 5° or less with respect to whichever of these plane orientations. A plane orientation that is misoriented 5° or less with respect to any crystallographically equivalent plane orientation selected from the group consisting of $\{1\text{-}10x\}$, $\{11\text{-}2y\}$, and $\{hk\text{-}(h+k)l\}$ enables crystal growth in the same manner as in $\{1\text{-}10x\}$, $\{11\text{-}2y\}$, or $\{hk\text{-}(h+k)l\}$ instances, and therefore III-nitride crystal of superior crystallinity can be grown stably onto a major surface with such plane orientation. Herein, "off-axis angle" means the angle that any given plane orientation and any other plane orientation form, and is measured by x-ray crystallography.

Figure 15:
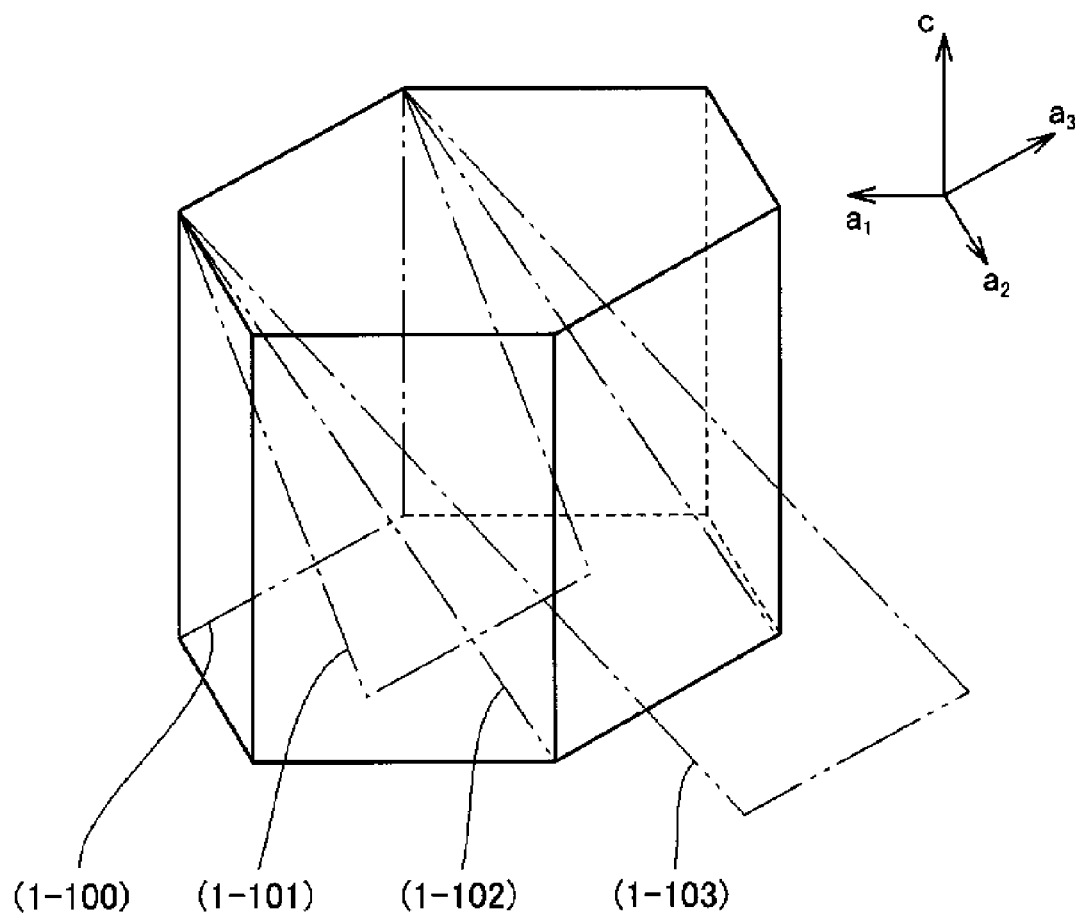
FIG. 15 is an oblique perspective view diagram summarily representing a concrete example of {1-10x} (x: a whole number) planes in a unit cell of a III-nitride crystal that is hexagonal.
Figure 16:
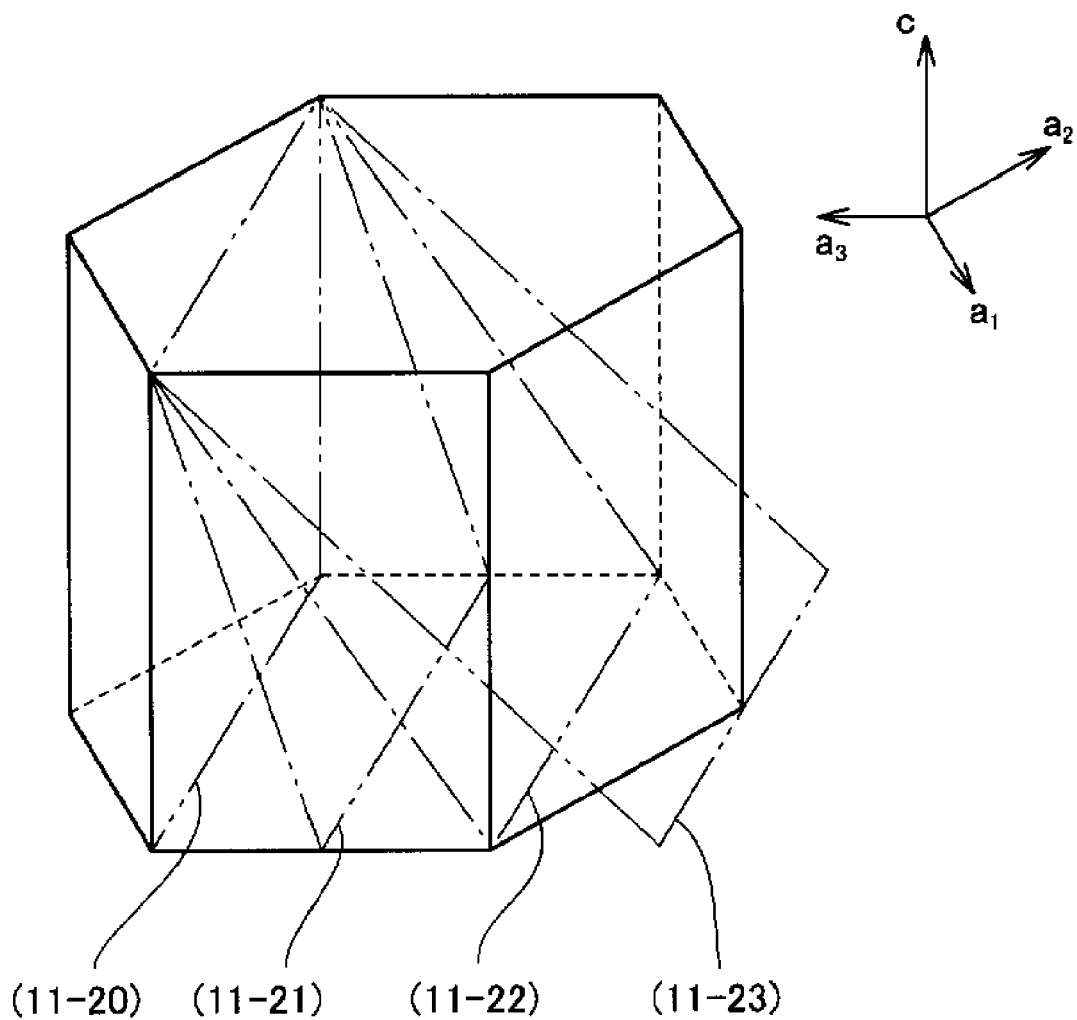
FIG. 16 is an oblique perspective view diagram summarily representing a concrete example of {11-2y} (y: a whole number) planes in a unit cell of a III-nitride crystal that is hexagonal.
Figure 17:
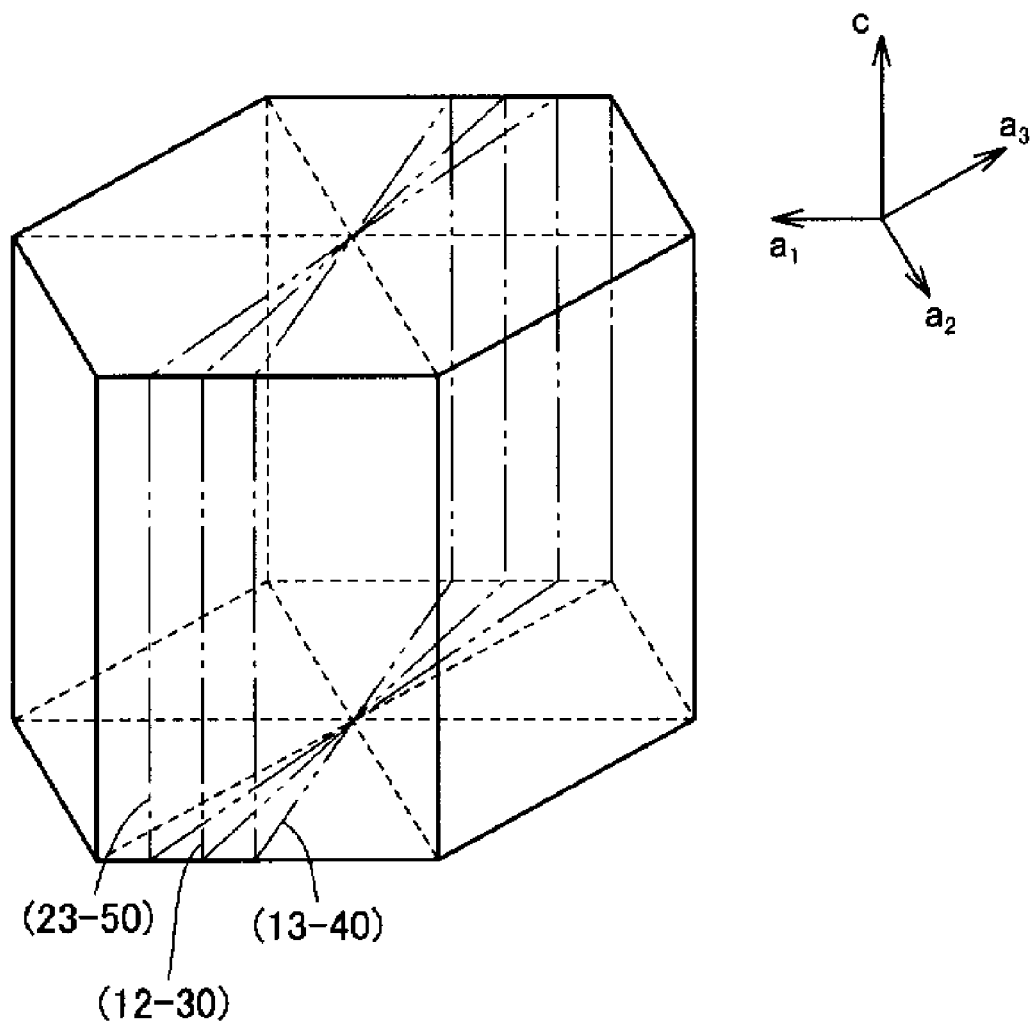
FIG. 17 is an oblique perspective view diagram summarily representing a concrete example of {hk-(h+k)l} (h, k and l: whole numbers) planes in a unit cell of a III-nitride crystal that is hexagonal.

For reference in the present description, specific examples of $\{1\text{-}10x\}$ planes (x: a whole number), $\{11\text{-}2y\}$ planes (y: a whole number), and $\{hk\text{-}(h+k)l\}$ planes (h, k and l: whole numbers) in a unit cell of III-nitride crystal that is hexagonal are depicted in FIGS. 15 through 17. Herein, the arrows $a_1$, $a_2$, $a_3$ and c are crystal axes for the cell unit of the hexagonal III-nitride crystal.

A face having any crystallographically equivalent plane orientation selected from the group consisting of $\{1\text{-}10x\}$, $\{11\text{-}2y\}$, and $\{hk\text{-}(h+k)l\}$ is in III-nitride crystal a stable face. In the growth of III-nitride crystal, characteristic of the high crystal growth rates afforded by vapor deposition, especially HVPE techniques, is that crystal growth in the c-axis direction (i.e., the [0001] direction) is rapid. Consequently, in III-nitride crystal grown by vapor-phase techniques such as HVPE, the (1-10±1) faces, the (1-10±2) faces, the (11-2±1) faces, the (11-2±2) faces, the (20-2±1) faces and the (22-4±1) faces prove to be more stable. On the other hand, because the crystal growth rate with liquid-phase growth is low, in III-nitride crystal grown by liquid-phase techniques, the (1-10±3) faces and the (11-2±3) faces prove to be more stable. It will be understood that owing to the cumbersomeness of writing out the notation for both the (10-11) face and the (10-1-1), the notations have been abbreviated as the "(10-1±1)" faces. The notations for the other plane orientations have been abbreviated in the same way.

In a III-nitride crystal manufacturing method in the present embodying mode, it is preferable that the aforementioned $\{h_0k_0i_0l_0\}$ be any crystallographically equivalent plane orientation selected from the group consisting of $\{1\text{-}100\}$, $\{11\text{-}20\}$, $\{1\text{-}10\pm2\}$, $\{11\text{-}2\pm2\}$, $\{20\text{-}2\pm1\}$ and $\{22\text{-}4\pm1\}$. Herein, because III-nitride crystal faces whose plane orientations are $\{1\text{-}100\}$, $\{11\text{-}20\}$, $\{1\text{-}10\pm2\}$, $\{11\text{-}2\pm2\}$, $\{20\text{-}2\pm1\}$ or $\{22\text{-}4\pm1\}$ are stable faces, III-nitride crystal of superior crystallinity can be grown stably onto a major surface with such plane orientation.

Again $\{h_0k_0i_0l_0\}$ may be, rather than any crystallographically equivalent plane orientation selected from the group consisting of $\{1\text{-}100\}$, $\{11\text{-}20\}$, $\{1\text{-}10\pm2\}$, $\{11\text{-}2\pm2\}$, $\{20\text{-}2\pm1\}$ and $\{22\text{-}4\pm1\}$, an off-axis angle of 5° or less with respect to whichever of these plane orientations. A plane orientation that is misoriented 5° or less with respect to any crystallographically equivalent plane orientation selected from the group consisting of $\{1\text{-}100\}$, $\{11\text{-}20\}$, $\{1\text{-}10\pm2\}$, $\{11\text{-}2\pm2\}$, $\{20\text{-}2\pm1\}$ and $\{22\text{-}4\pm1\}$ enables crystal growth in the same manner as in $\{1\text{-}100\}$, $\{11\text{-}20\}$, $\{1\text{-}10\pm2\}$, $\{11\text{-}2\pm2\}$, $\{20\text{-}2\pm1\}$ and $\{22\text{-}4\pm1\}$ instances, and therefore III-nitride crystal of superior crystallinity can be grown stably onto a major surface with such plane orientation.

It is also preferable in a III-nitride crystal manufacturing method in the present embodying mode that $\{h_0k_0i_0l_0\}$ be $\{1\text{-}100\}$. In III-nitride crystal, $\{1\text{-}100\}$ is a stable plane and at the same time is a cleavage plane; therefore, III-nitride crystal of superior crystallinity can be stably grown, and by cleaving the grown III-nitride crystal along the $\{1\text{-}100\}$ planes, III-nitride crystal substrates of superior crystallinity, having a major surface of {1-100} plane orientation can be readily produced.

Again $\{h_0k_0i_0l_0\}$ may be, rather than {1-100}, an off-axis angle of 5° or less with respect to this plane orientation. Being misoriented 5° or less with respect to {1-100} enables crystal growth in the same manner as in implementations on {1-100}, and therefore III-nitride crystal of superior crystallinity can be grown stably onto a major surface with such plane orientation.

Furthermore, in a III-nitride crystal manufacturing method in the present embodying mode, the roughness average Ra of faces 10pt, 10qt along which the plurality of III-nitride crystal substrates 10p, 10q adjoin each other (here, and likewise below, termed "adjoining faces 10pt, 10qt") preferably is 50 nm or less, more preferably 5 nm or less. If the roughness average Ra of the adjoining faces 10pt, 10qt exceeds 50 nm, the crystallinity of the region 20t in the III-nitride crystal 20 above the adjoining faces 10pt, 10qt and their proximity (which will be termed "adjoining-substrate supra-region 20t") will be compromised. Here, "roughness average Ra of a surface" means arithmetic mean roughness Ra, defined in JIS B 0601, and specifically it refers to sampling "cutoff" lengths from a roughness profile along its mean line, and summing, and averaging by cutoff length, distances (the absolute value of deviations) from the mean line to the roughness profile in the sampling section. The surface roughness average Ra can be measured employing an atomic force microscope (AFM) and so on.

In a III-nitride crystal manufacturing method in the present embodying mode, then, in order to have the roughness average Ra of the adjoining faces 10pt, 10qt of the plurality of III-nitride crystal substrates 10p, 10q be 50 nm or less, after the first step (slice-off substrates step) and before the second step (substrate placement step), a step of grinding and/or polishing the edge faces that will become the adjoining faces 10pt, 10qt of the plurality of III-nitride crystal substrates 10p, 10q (also termed grinding/polishing step hereinafter) preferably is included.

Also in a III-nitride crystal manufacturing method in the present embodying mode, from the perspective of further enhancing the crystallinity of the III-nitride crystal that is grown, after the first step (slice-off substrates step) and before the second step (substrate placement step), a step of grinding and/or polishing (grinding/polishing step) the $\{h_0k_0i_0l_0\}$ major surfaces 10pm, 10qm—which are the surfaces onto which the III-nitride crystal is grown—of the plurality of III-nitride crystal substrates 10p, 10q preferably is included. It is preferable that the surface roughness of the $\{h_0k_0i_0l_0\}$ major surfaces 10pm, 10qm resulting from such grinding/polishing step be 50 nm or less; that the roughness be 5 nm is more preferable.

Another advantageous condition in a III-nitride crystal manufacturing method in the present embodying mode is that the temperature at which the III-nitride crystal 20 is grown be 2000° C. or more. This is because with III-nitride crystal grown at a temperature of 2000° C. or more, the crystallinity proves to be uniform globally across the surface where the crystal is grown. Here, "crystallinity is uniform" signifies that the full-width-at-half-maximum in-plane profile of the peak resulting from an x-ray diffraction rocking-curve analysis of the $\{h_0k_0i_0l_0\}$ face is narrow, and that the dislocation-density in-plane distribution as quantified by cathodoluminescence spectroscopy (CL) or etch-pit density (EP) measurement is narrow.

A still further advantageous condition in a III-nitride crystal manufacturing method in the present embodying mode is that the method whereby the III-nitride crystal 20 is grown be sublimation growth. This is because by sublimation methods, III-nitride crystal is grown at temperatures of 2000° C. or more, and therefore the crystallinity of the III-nitride crystal that is grown proves to be uniform globally across the crystal-growth surface.

Embodiments

III-Nitride Bulk Crystal Preparation 1

Figure 2A:
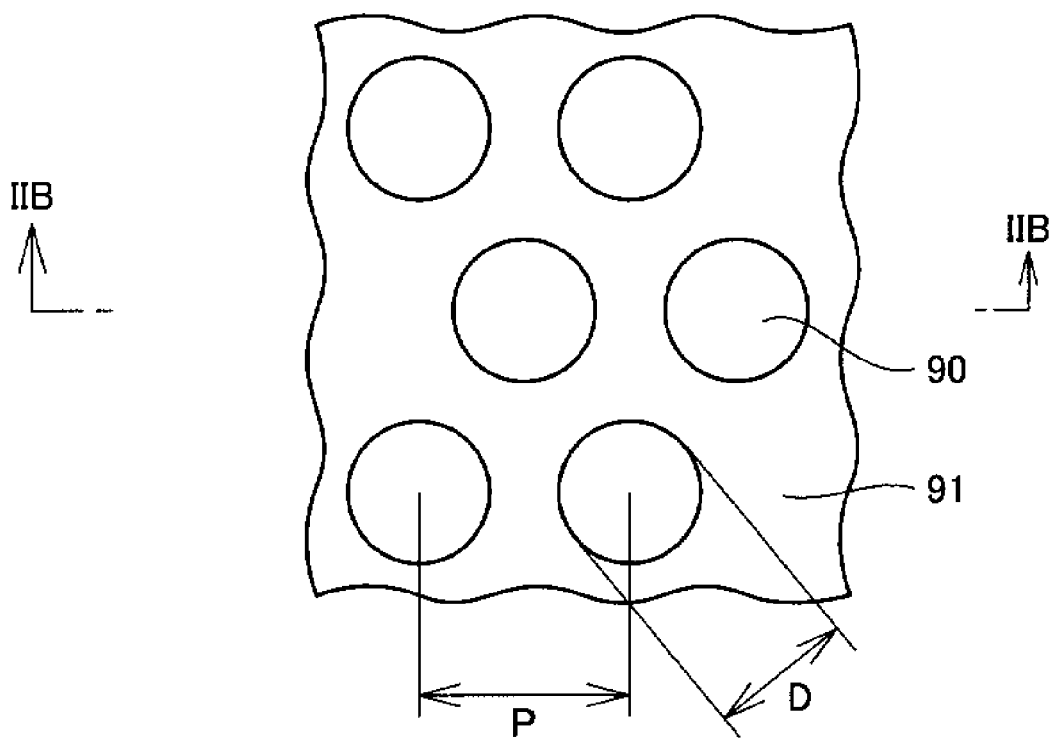
FIG. 2A, a diagram summarily illustrating an undersubstrate for growing bulk III-nitride crystal, represents a schematic plan view.
Figure 2B:
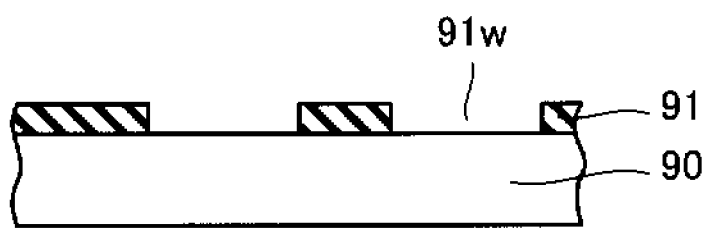
FIG. 2B, a diagram summarily illustrating an undersubstrate for growing bulk III-nitride crystal, represents a schematic sectional view along IIB-IIB in FIG. 2A.

GaN bulk crystal, as III-nitride bulk crystal utilized in a III-nitride crystal manufacturing method involving the present invention, was manufactured by a method as below, wherein reference is made to FIG. 2.

Initially, an $SiO_2$ layer of 100 nm thickness was formed as a mask layer 91 by sputter deposition onto, as an undersubstrate 90, a GaAs substrate of 50 mm diameter, 0.8 mm thickness, having a (111) A-plane major surface. Next, windows 91w, as illustrated FIGS. 2A and 2B, whose diameter D was 2 μm were formed in the mask by photolithography and etching, arrayed at a pitch P of 4 μm in a close-hexagonal packing pattern. In this case the GaAs substrate 90 was exposed through the windows 91w.

Next, GaN bulk crystal, as III-nitride bulk crystal, was grown by HVPE onto the GaAs substrate 90 on which the mask 91 having a plurality of the windows 91w had been formed. Specifically, a GaN low-temperature layer of 80 nm thickness was grown by HVPE at 500° C. onto the GaAs substrate, onto that layer subsequently a GaN intermediate layer of 60 μm thickness was grown at 950° C., after which GaN bulk crystal of 5 mm thickness was grown at 1050° C. onto the intermediate layer.

Next, the GaAs substrate was removed from the GaN bulk crystal by an etching process employing aqua regia, to yield GaN bulk crystal of 50 mm diameter and 3 mm thickness, as III-nitride bulk crystal.

Embodiment 1

Figure 3A:
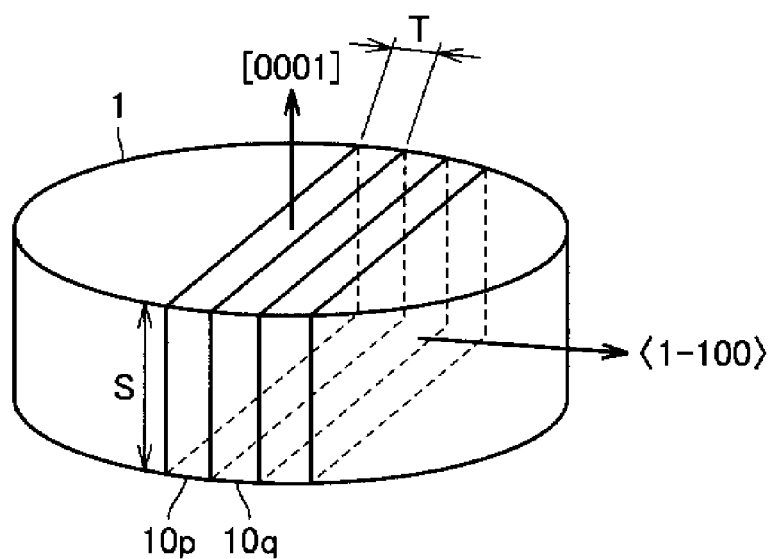
FIG. 3A, a schematic diagram for illustrating one example of a III-nitride crystal manufacturing method involving the present invention, is an oblique perspective view summarily representing a process step of slicing off substrates.

To begin with, referring to FIG. 3A, the (0001) face and (000-1) face—the two major surfaces—of GaN bulk crystal (III-nitride bulk crystal 1) were ground and polished to bring the roughness average Ra of either major surface to 5 nm. Here measurement of the surface roughness average Ra was carried out by AFM.

Next, referring to FIG. 3A, the GaN bulk crystal (III-nitride bulk crystal 1) whose roughness average Ra on either of its major surfaces had been made 5 nm was sawed along a plurality of planes perpendicular to a <1-100> direction to slice off a plurality of GaN crystal substrates (III-nitride crystal substrates 10p, 10q) whose width S was 3 mm, length L was 20 to 50 mm, and thickness T was 1 mm, having {1-100} major surfaces. Subsequently, the not-ground and not-polished four sides of each sliced-off GaN crystal substrate were ground and polished, to bring the roughness average Ra of the four surfaces to 5 nm. A plurality of GaN crystal substrates whose roughness average Ra on the {1-100} major surfaces was 5 nm was thus obtained. Among these GaN crystal substrates were GaN crystal substrates whose major-surface plane orientation did not coincide perfectly with {1-100}, but the plane orientation of the major surface of such GaN crystal substrates in all cases was misoriented by 5° or less with respect to {1-100}. Here, the off-axis angle was measured by x-ray crystallography.

Figure 3B:
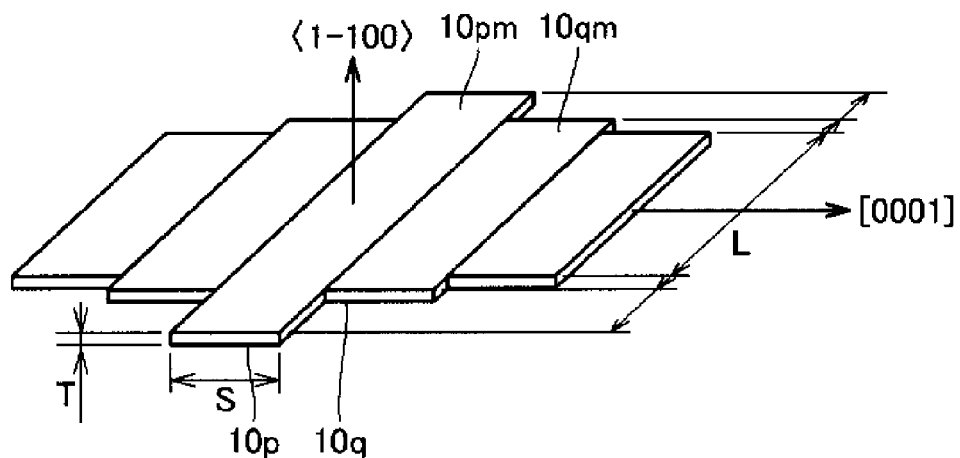
FIG. 3B, a schematic diagram for illustrating one example of a III-nitride crystal manufacturing method involving the present invention, is an oblique perspective view summarily representing a process step of arranging substrates into a row.

Next, referring to FIG. 3B, these GaN crystal substrates were disposed adjoining each other sideways, in a manner such that the (1-100) major surfaces 10pm, 10qm of the plurality of GaN crystal substrates (III-nitride crystal substrates 10p, 10q) would be parallel to each other, and such that the [0001] directions in the GaN crystal substrates (III-nitride crystal substrates 10p, 10q) would be oriented in the same way. In this instance, referring also to FIG. 3C, the roughness average Ra of the adjoining faces 10*pt*, 10*qt* of the plurality of GaN crystal substrates (III-nitride crystal substrates 10*p*, 10*q*) was 5 nm.

Next, with reference again to FIG. 3C, the (1-100) major surfaces 10*pm*, 10*qm* of the situated plurality of GaN crystal substrates (III-nitride crystal substrates 10*p*, 10*q*) were processed for two hours at 800° C. under an atmosphere that was a gaseous mixture of 10 volume % hydrogen chloride and 90 volume % nitrogen, and afterwards, by HVPE and at a crystal growth temperature of 1050° C., GaN crystal (epitaxial III-nitride crystal 20) was grown onto the major surfaces 10*pm*, 10*qm* for 50 hours at a deposition rate of 20 μm/hr, yielding a III-nitride crystal composite.

The obtained GaN crystal (epitaxial III-nitride crystal 20), free of abnormal growth even in the adjoining-substrate supra-regions 20*t*, had a (1-100) major surface 20*m*. The crystallinity of the GaN crystal (epitaxial III-nitride crystal 20) was characterized by an x-ray diffraction rocking-curve analysis of the (1-100) plane. With this GaN crystal, the direct-over-substrate regions 20*s* (meaning—likewise hereinafter—the regions 20*s* that are directly above the plural III-nitride crystal substrates 10*p*, 10*q*), demonstrated diffraction peaks undivided in the tip, with the full-width at half-maximum being 100 arcsec. In the adjoining-substrate supra-regions 20*t*, meanwhile, diffraction peaks with divisions in the tip were demonstrated, with the full-width at half-maximum being 300 arcsec. It should be understood that a "principal impurity(ies)" as given in the present specification is an impurity(ies) that is present in an amount occupying at least 95% among the entirety of impurities in the III-nitride crystal. Saying "the principal impurities are oxygen atoms and silicon atoms" means "oxygen atoms (O) and silicon atoms (Si) occupy at least 95% among the entirety of the impurities in the III-nitride crystal."

Furthermore, threading dislocation density in the (1-100) major surface 20*m* of the GaN crystal was determined by cathodoluminescence spectroscopy (termed "CL" hereinafter), whereupon the density was $1 \times 10^7$ cm$^{-2}$ in the direct-over-substrate regions 20*s*, and $3 \times 10^7$ cm$^{-2}$ in the adjoining-substrate supra-regions 20*t*. In addition, the carrier concentration in the GaN crystal was determined by Hall-effect measurements, whereupon it was $5 \times 10^{18}$ cm$^{-3}$. And the principal impurities in the GaN crystal according to SIMS (secondary ion mass spectrometry, likewise hereinafter) were oxygen (O) atoms and silicon (Si) atoms. The results are tabulated in Table I.

It should be understood that in Embodiment 1, the major-surface plane orientations of the plurality of GaN crystal substrates that were the surfaces onto which the GaN crystal was grown were all (1-100), in that although a few or more might have been (-1100), the crystallographic equivalent of (1-100), they would lead to the same results.

Embodiment 2

Reference is again made to FIG. 3A: Apart from grinding and polishing the (0001) face and (000-1) face—the two major surfaces—of GaN bulk crystal (III-nitride bulk crystal 1) to bring the roughness average Ra of either major surface to 50 nm, in the same manner as in Embodiment 1, plural GaN crystal substrates (III-nitride crystal substrates 10*p*, 10*q*) were sliced off, and the not-ground and not-polished four sides of each GaN crystal substrate were ground and polished, to bring the roughness average Ra of the four surfaces to 5 nm. Among the plurality of GaN crystal substrates were GaN crystal substrates whose major-surface plane orientation did not coincide perfectly with {1-100}, but the plane orientation of the major surface of such GaN crystal substrates in all cases was misoriented by 5° or less with respect to {1-100}.

Figure 4:
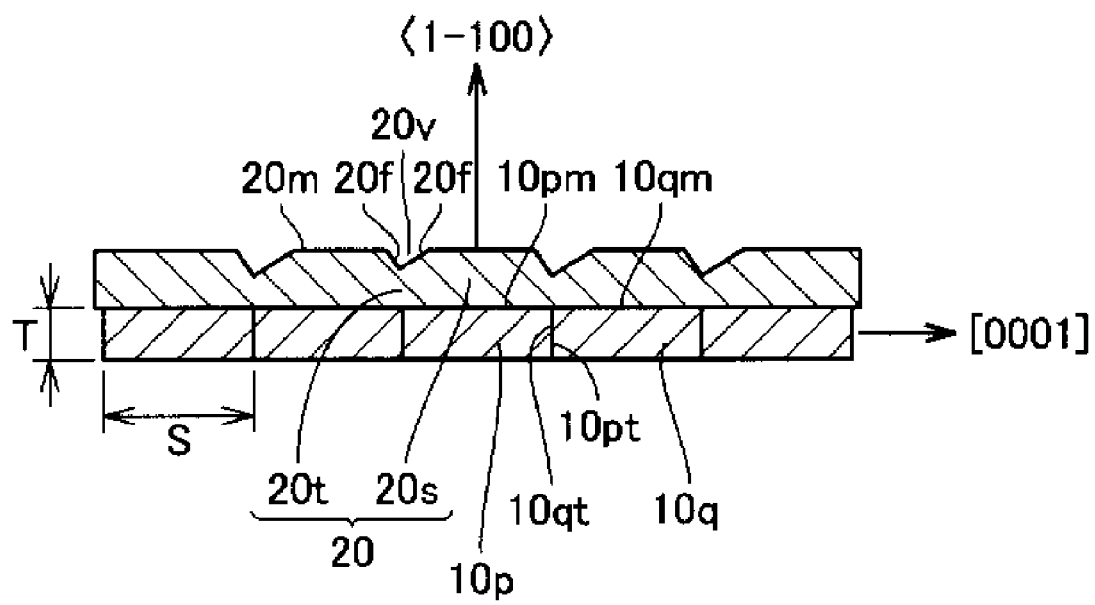
FIG. 4 is a sectional view summarily representing a crystal-growth process step in another example of a III-nitride crystal manufacturing method involving the present invention.

Next, referring to FIG. 3B, the plural GaN crystal substrates (III-nitride crystal substrates 10*p*, 10*q*) were situated in the same manner as in Embodiment 1. In this case, referring also to FIG. 4, the roughness average Ra of the adjoining faces 10*pt*, 10*qt* of the plurality of GaN crystal substrates was 50 nm.

Next, with reference again to FIG. 4: The (1-100) major surfaces 10*pm*, 10*qm* of the situated plurality of GaN crystal substrates (III-nitride crystal substrates 10*p*, 10*q*) were processed in the same way as that of Embodiment 1, and thereafter GaN crystal (III-nitride crystal 20) was grown onto the major surfaces 10*pm*, 10*qm* under the same conditions as those of Embodiment 1.

The obtained GaN crystal (III-nitride crystal 20) had a (1-100) major surface 20*m* in which pits 20*v* constituted by a plurality of facets 20*f* were formed in the adjoining-substrate supra-regions 20*t*. Further, in an x-ray diffraction rocking-curve analysis of the (1-100) plane of the GaN crystal (III-nitride crystal 20), the direct-over-substrate regions 20*s* demonstrated diffraction peaks undivided in the tip, with the full-width at half-maximum being 100 arcsec. In the adjoining-substrate supra-regions 20*t*, meanwhile, diffraction peaks with divisions in the tip were demonstrated, with the full-width at half-maximum being 800 arcsec.

Furthermore, threading dislocation density in the (1-100) major surface 20*m* of the GaN crystal was $1 \times 10^7$ cm$^{-2}$ in the direct-over-substrate regions 20*s*, and $8 \times 10^7$ cm$^{-2}$ in the adjoining-substrate supra-regions 20*t*. In addition, the carrier concentration in the GaN crystal was $5 \times 10^{18}$ cm$^{-3}$, while the principal impurities were oxygen atoms and silicon atoms. The results are tabulated in Table I.

It should be understood that in Embodiment 2, the major-surface plane orientations of the plurality of GaN crystal substrates that were the surfaces onto which the GaN crystal was grown were all (1-100), in that although a few or more might have been (-1100), the crystallographic equivalent of (1-100), they would lead to the same results.

Embodiment 3

Figure 5A:
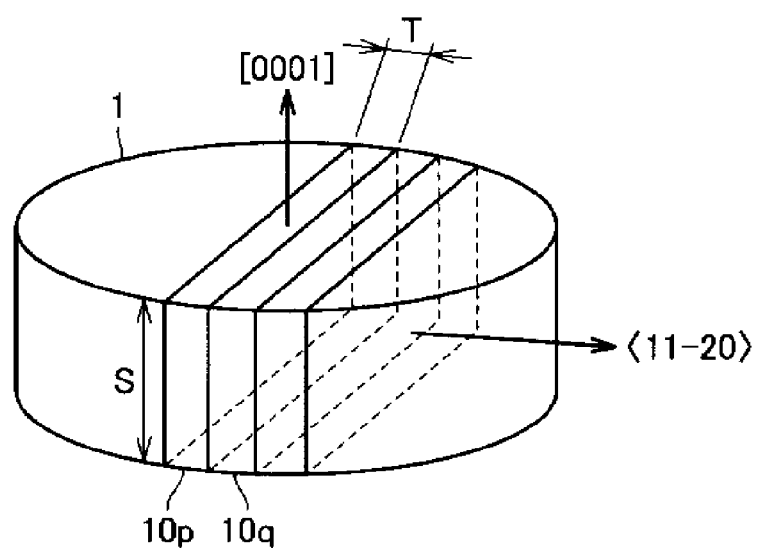
FIG. 5A, a schematic diagram for illustrating still another example of a III-nitride crystal manufacturing method involving the present invention, is an oblique perspective view summarily representing a process step of slicing off substrates.

To begin with, referring to FIG. 5A, the (0001) face and (000-1) face—the two major surfaces—of GaN bulk crystal (III-nitride bulk crystal 1) were ground and polished to bring the roughness average Ra of either major surface to 5 nm.

Next, again referring to FIG. 5A: The GaN bulk crystal (III-nitride bulk crystal 1) whose roughness average Ra on either of its major surfaces had been made 5 nm was sawed along a plurality of planes perpendicular to a <11-20> direction to slice off a plurality of GaN crystal substrates (III-nitride crystal substrates 10*p*, 10*q*) whose width S was 3 mm, length L was 20 to 50 mm, and thickness T was 1 mm, having {11-20} major surfaces. Subsequently, the not-ground and not-polished four sides of each sliced-off GaN crystal substrate were ground and polished, to bring the roughness average Ra of the four surfaces to 5 nm. A plurality of GaN crystal substrates whose roughness average Ra on the {11-20} major surfaces was 5 nm was thus obtained. Among these GaN crystal substrates were GaN crystal substrates whose major-surface plane orientation did not coincide perfectly with {11-20}, but the plane orientation of the major surface of such GaN crystal substrates in all cases was misoriented by 5° or less with respect to {11-20}.

Figure 5B:
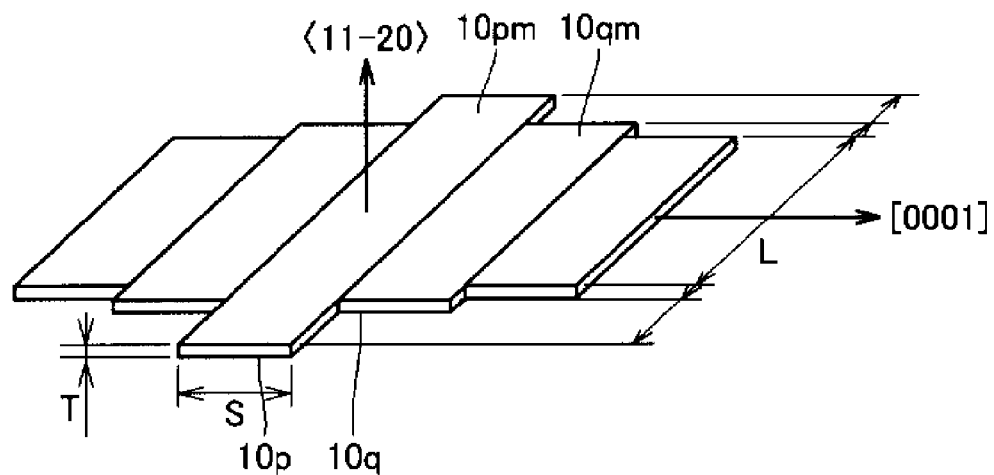
FIG. 5B, a schematic diagram for illustrating the still other example of a III-nitride crystal manufacturing method involving the present invention, is an oblique perspective view summarily representing a process step of arranging substrates into a row.

Next, referring to FIG. 5B, these GaN crystal substrates were disposed adjoining each other sideways, in a manner such that the (11-20) major surfaces 10*pm*, 10*qm* of the plurality of GaN crystal substrates (III-nitride crystal substrates 10*p*, 10*q*) would be parallel to each other, and such that the

Figure 5C:
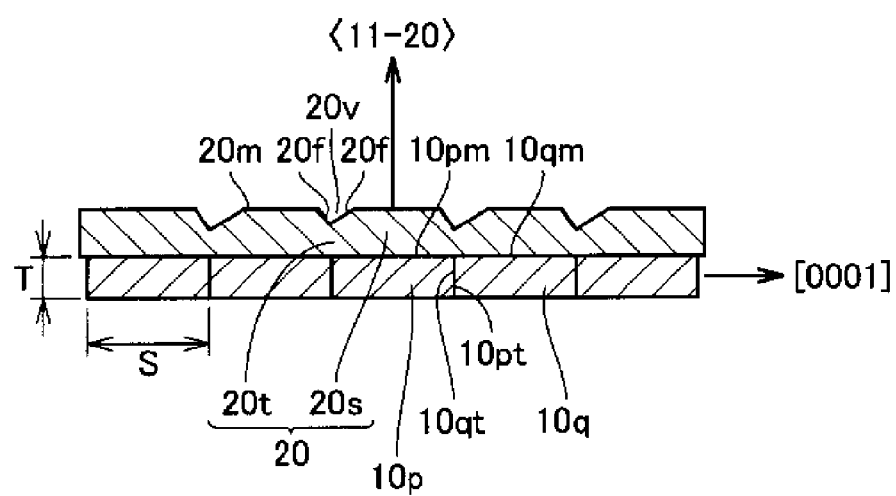
FIG. 5C, a schematic diagram for illustrating the still other example of a III-nitride crystal manufacturing method involving the present invention, is a sectional view summarily representing a crystal-growth process step.

[0001] directions in the GaN crystal substrates would be oriented in the same way. In this instance, referring also to FIG. 5C, the roughness average Ra of the adjoining faces 10*pt*, 10*qt* of the plurality of GaN crystal substrates was 5 nm.

Next, with reference again to FIG. 5C: The (11-20) major surfaces 10*pm*, 10*qm* of the situated plurality of GaN crystal substrates (III-nitride crystal substrates 10*p*, 10*q*) were processed in the same way as that of Embodiment 1, and thereafter GaN crystal (III-nitride crystal 20) was grown onto the major surfaces 10*pm*, 10*qm* under the same conditions as those of Embodiment 1.

The obtained GaN crystal (III-nitride crystal 20) had a (11-20) major surface 20*m* in which pits 20*v* defined by a plurality of facets 20*f* were formed in the adjoining-substrate supra-regions 20*t*. Further, in an x-ray diffraction rocking-curve analysis of the (11-20) plane of the GaN crystal (III-nitride crystal 20), the direct-over-substrate regions 20*s* demonstrated diffraction peaks undivided in the tip, with the full-width at half-maximum being 250 arcsec. In the adjoining-substrate supra-regions 20*t*, meanwhile, diffraction peaks with divisions in the tip were demonstrated, with the full-width at half-maximum being 620 arcsec.

Furthermore, threading dislocation density in the (11-20) major surface 20*m* of the GaN crystal was $1\times10^7$ cm$^{-2}$ in the direct-over-substrate regions 20*s*, and $8\times10^7$ cm$^{-2}$ in the adjoining-substrate supra-regions 20*t*. In addition, the carrier concentration in the GaN crystal was $5\times10^{18}$ cm$^{-3}$, while the principal impurities were oxygen atoms and silicon atoms. The results are tabulated in Table I.

It should be understood that in Embodiment 3, the major-surface plane orientations of the plurality of GaN crystal substrates that were the surfaces onto which the GaN crystal was grown were all (11-20), in that although a few or more might have been (-1-120), the crystallographic equivalent of (11-20), they would lead to the same results.

Embodiment 4

Figure 6A:
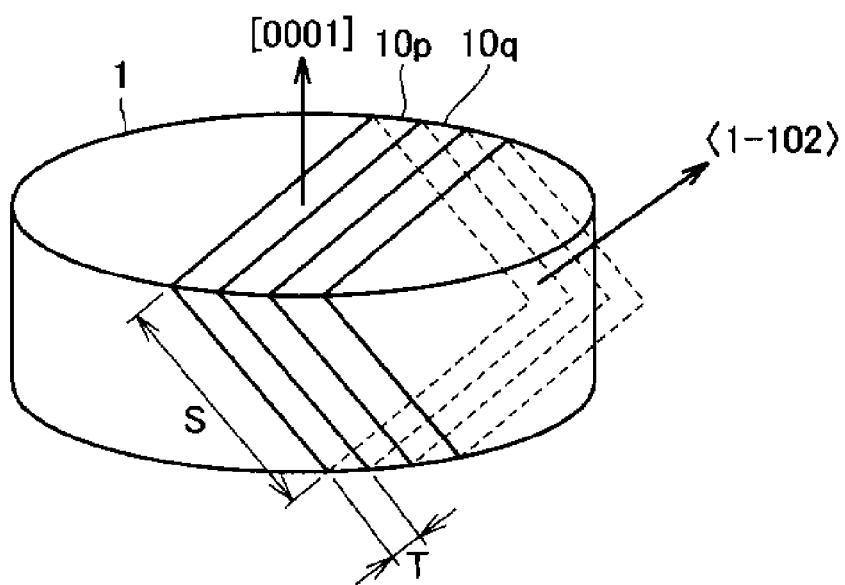
FIG. 6A, a schematic diagram for illustrating yet another example of a III-nitride crystal manufacturing method involving the present invention, is an oblique perspective view summarily representing a process step of slicing off substrates.

To begin with, referring to FIG. 6A, the (0001) face and (000-1) face—the two major surfaces—of GaN bulk crystal (III-nitride bulk crystal 1) were ground to bring the roughness average Ra of either major surface to 50 nm.

Next, again referring to FIG. 6A: The GaN bulk crystal (III-nitride bulk crystal 1) whose roughness average Ra on either of its major surfaces had been made 50 nm was sawed along a plurality of planes perpendicular to a <1-102> direction to slice off a plurality of GaN crystal substrates (III-nitride crystal substrates 10*p*, 10*q*) whose width S was 5 mm, length L was 20 to 50 mm, and thickness T was 1 mm, having {1-102} major surfaces. Subsequently, the six sides of each sliced-off GaN crystal substrate were ground and polished, to bring the surfaces' roughness average Ra to 5 nm. A plurality of GaN crystal substrates whose roughness average Ra on the {1-102} major surfaces was 5 nm was thus obtained. Among these GaN crystal substrates were GaN crystal substrates whose major-surface plane orientation did not coincide perfectly with {1-102}, but the plane orientation of the major surface of such GaN crystal substrates in all cases was misoriented by 5° or less with respect to {1-102}.

Figure 6B:
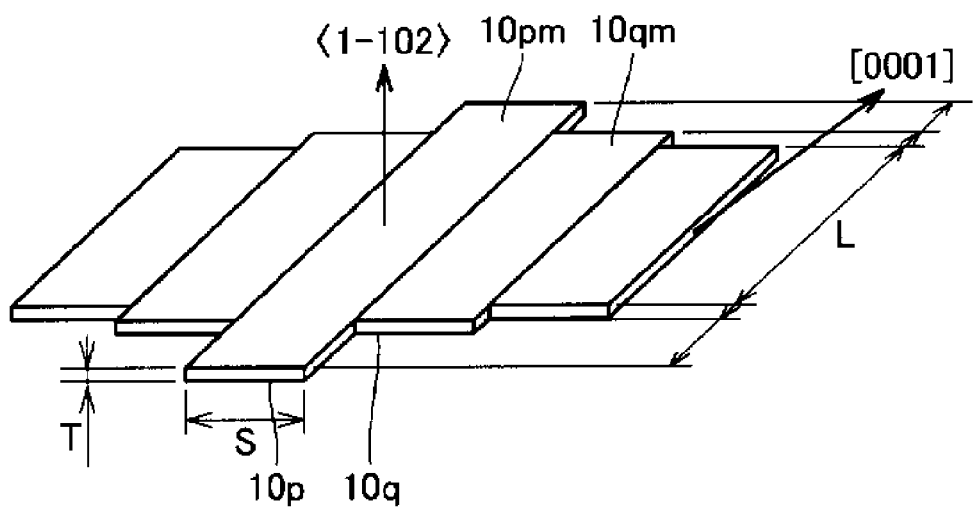
FIG. 6B, a schematic diagram for illustrating the yet other example of a III-nitride crystal manufacturing method involving the present invention, is an oblique perspective view summarily representing a process step of arranging substrates into a row.
Figure 6C:
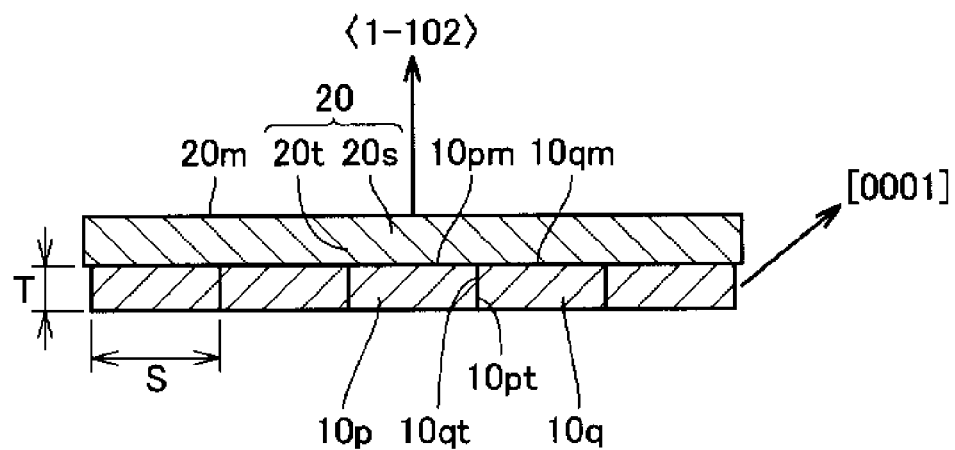
FIG. 6C, a schematic diagram for illustrating the yet other example of a III-nitride crystal manufacturing method involving the present invention, is a sectional view summarily representing a crystal-growth process step.

Next, referring to FIG. 6B, these GaN crystal substrates were disposed adjoining each other sideways, in a manner such that the (1-102) major surfaces 10*pm*, 10*qm* of the plurality of GaN crystal substrates (III-nitride crystal substrates 10*p*, 10*q*) would be parallel to each other, and such that the [0001] directions in the GaN crystal substrates would be oriented in the same way. In this instance, referring also to FIG. 6C, the roughness average Ra of the adjoining faces 10*pt*, 10*qt* of the plurality of GaN crystal substrates was 5 nm.

Next, with reference again to FIG. 6C: The (1-102) major surfaces 10*pm*, 10*qm* of the situated plurality of GaN crystal substrates (III-nitride crystal substrates 10*p*, 10*q*) were processed in the same way as that of Embodiment 1, and thereafter GaN crystal (III-nitride crystal 20) was grown onto the major surfaces 10*pm*, 10*qm* under the same conditions as those of Embodiment 1.

The obtained GaN crystal, free of abnormal growth even in the adjoining-substrate supra-regions 20*t*, had a (1-102) major surface 20*m*. In an x-ray diffraction rocking-curve analysis of the (1-102) plane of the GaN crystal (III-nitride crystal 20), the direct-over-substrate regions 20*s* demonstrated diffraction peaks undivided in the tip, with the full-width at half-maximum being 120 arcsec. In the adjoining-substrate supra-regions 20*t*, meanwhile, diffraction peaks with divisions in the tip were demonstrated, with the full-width at half-maximum being 480 arcsec.

Furthermore, threading dislocation density in the (1-102) major surface 20*m* of the GaN crystal was $1\times10^7$ cm$^{-2}$ in the direct-over-substrate regions 20*s*, and $6\times10^7$ cm$^{-2}$ in the adjoining-substrate supra-regions 20*t*. In addition, the carrier concentration in the GaN crystal was $5\times10^{18}$ cm$^{-3}$, while the principal impurities were oxygen atoms and silicon atoms. The results are tabulated in Table I.

It should be understood that in Embodiment 4, the major-surface plane orientations of the plurality of GaN crystal substrates that were the surfaces onto which the GaN crystal was grown were all (1-102), in that although a few or more might have been (-1102), the crystallographic equivalent of (1-102), they would lead to the same results.

Embodiment 5

To begin with, referring to FIG. 6A, the (0001) face and (000-1) face—the two major surfaces—of GaN bulk crystal (III-nitride bulk crystal 1) were ground to bring the roughness average Ra of either major surface to 50 nm.

Next, again referring to FIG. 6A: The GaN bulk crystal (III-nitride bulk crystal 1) whose roughness average Ra on either of its major surfaces had been made 50 nm was sawed along a plurality of planes perpendicular to a <1-10-2> direction to slice off a plurality of GaN crystal substrates (III-nitride crystal substrates 10*p*, 10*q*) whose width S was 5 mm, length L was 20 to 50 mm, and thickness T was 1 mm, having {1-10-2} major surfaces. Subsequently, the six sides of each sliced-off GaN crystal substrate were ground and polished, to bring the surfaces' roughness average Ra to 5 nm. A plurality of GaN crystal substrates whose roughness average Ra on the {1-10-2} major surfaces was 5 nm was thus obtained. Among these GaN crystal substrates were GaN crystal substrates whose major-surface plane orientation did not coincide perfectly with {1-10-2}, but the plane orientation of the major surface of such GaN crystal substrates in all cases was misoriented by 5° or less with respect to {1-10-2}.

Figure 6D:
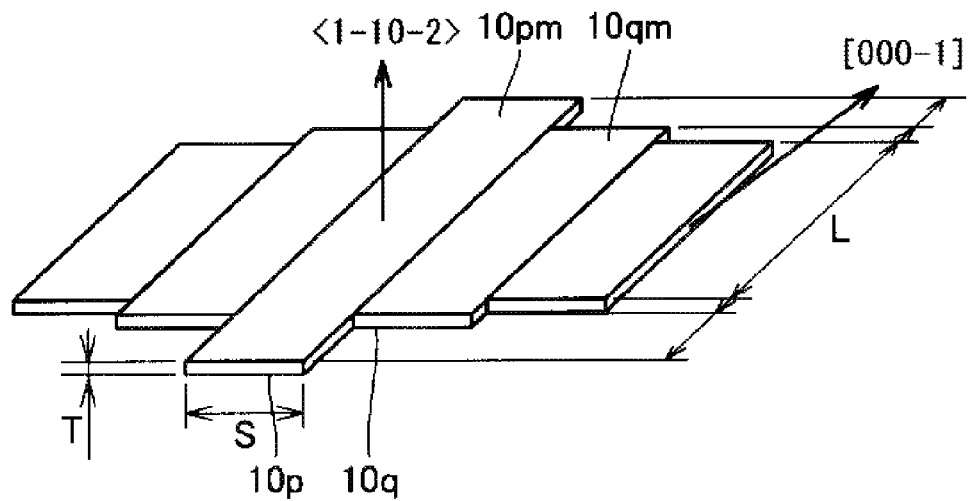
FIG. 6D, a schematic diagram for illustrating yet another example of a III-nitride crystal manufacturing method involving the present invention, is an oblique perspective view summarily representing a process step of arranging substrates into a row.

Next, referring to FIG. 6D, these GaN crystal substrates were disposed adjoining each other sideways, in a manner such that the (1-10-2) major surfaces 10*pm*, 10*qm* of the plurality of GaN crystal substrates (III-nitride crystal substrates 10*p*, 10*q*) would be parallel to each other, and such that the [0001] directions in the GaN crystal substrates would be oriented in the same way. In this instance, referring also to FIG. 6C, the roughness average Ra of the adjoining faces 10*pt*, 10*qt* of the plurality of GaN crystal substrates was 5 nm.

Figure 6E:
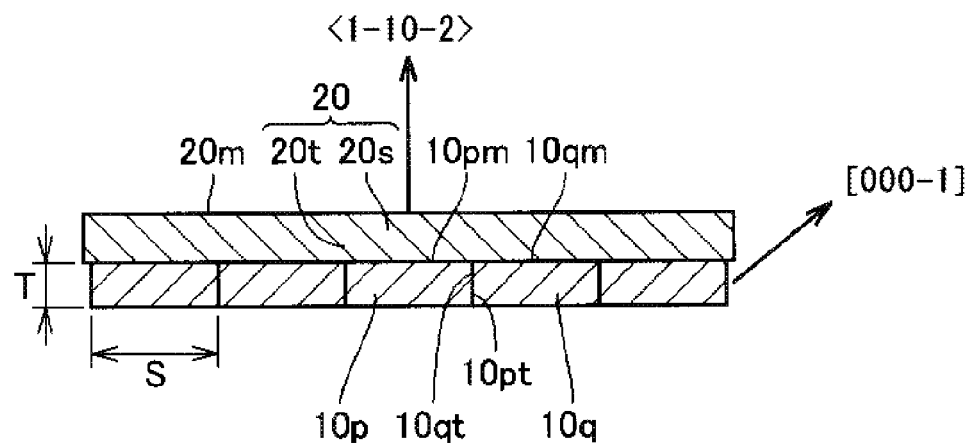
FIG. 6E, a schematic diagram for illustrating the yet other example of a III-nitride crystal manufacturing method involving the present invention, is a sectional view summarily representing a crystal-growth process step.

With reference now to FIG. 6E: Next, the (1-10-2) major surfaces 10*pm*, 10*qm* of the situated plurality of GaN crystal substrates (III-nitride crystal substrates 10*p*, 10*q*) were processed in the same way as that of Embodiment 1, and thereafter GaN crystal (III-nitride crystal 20) was grown onto the major surfaces 10pm, 10qm under the same conditions as those of Embodiment 1.

The obtained GaN crystal, free of abnormal growth even in the adjoining-substrate supra-regions 20t, had a (1-10-2) major surface 20m. In an x-ray diffraction rocking-curve analysis of the (1-10-2) plane of the GaN crystal (III-nitride crystal 20), the direct-over-substrate regions 20s demonstrated diffraction peaks undivided in the tip, with the full-width at half-maximum being 100 arcsec. In the adjoining-substrate supra-regions 20t, meanwhile, diffraction peaks with divisions in the tip were demonstrated, with the full-width at half-maximum being 420 arcsec.

Furthermore, threading dislocation density in the (1-10-2) major surface 20m of the GaN crystal was $1 \times 10^7$ cm$^{-2}$ in the direct-over-substrate regions 20s, and $6 \times 10^7$ cm$^{-2}$ in the adjoining-substrate supra-regions 20t. In addition, the carrier concentration in the GaN crystal was $5 \times 10^{18}$ cm$^{-3}$, while the principal impurities were oxygen atoms and silicon atoms. The results are tabulated in Table I.

It should be understood that in Embodiment 5, the major-surface plane orientations of the plurality of GaN crystal substrates that were the surfaces onto which the GaN crystal was grown were all (1-10-2), in that although a few or more might have been (-110-2), the crystallographic equivalent of (1-10-2), they would lead to the same results.

Embodiment 6

Figure 7A:
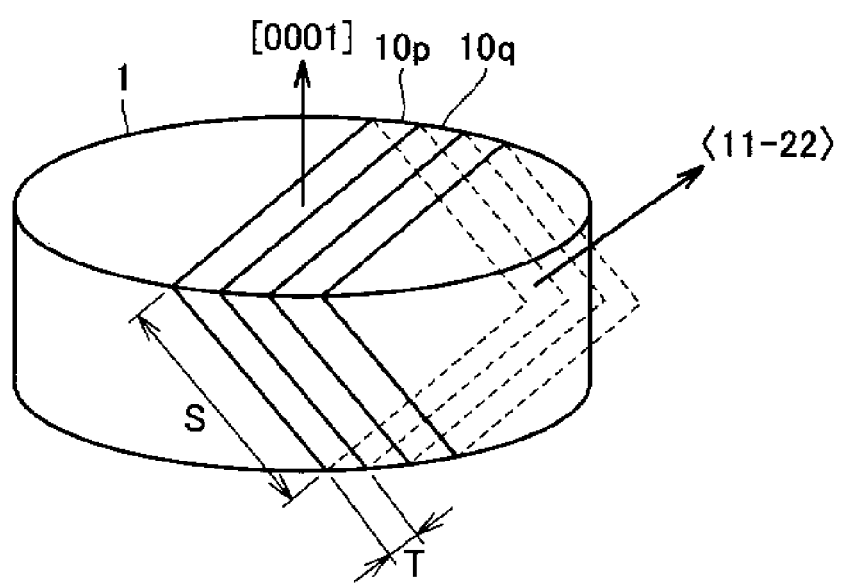
FIG. 7A, a schematic diagram for illustrating a further example of a III-nitride crystal manufacturing method involving the present invention, is an oblique perspective view summarily representing a process step of slicing off substrates.

To begin with, referring to FIG. 7A, the (0001) face and (000-1) face—the two major surfaces—of GaN bulk crystal (III-nitride bulk crystal 1) were ground to bring the roughness average Ra of either major surface to 50 nm.

Next, again referring to FIG. 7A: The GaN bulk crystal (III-nitride bulk crystal 1) whose roughness average Ra on either of its major surfaces had been made 50 nm was sawed along a plurality of planes perpendicular to a <11-22> direction to slice off a plurality of GaN crystal substrates (III-nitride crystal substrates 10p, 10q) whose width S was 5 mm, length L was 20 to 50 mm, and thickness T was 1 mm, having {11-22} major surfaces. Subsequently, the six sides of each sliced-off GaN crystal substrate were ground and polished, to bring the roughness average Ra of the six surfaces to 5 nm. A plurality of GaN crystal substrates whose roughness average Ra on the {11-22} major surfaces was 5 nm was thus obtained. Among these GaN crystal substrates were GaN crystal substrates whose major-surface plane orientation did not coincide perfectly with {11-22}, but the plane orientation of the major surface of such GaN crystal substrates in all cases was misoriented by 5° or less with respect to {11-22}.

Figure 7B:
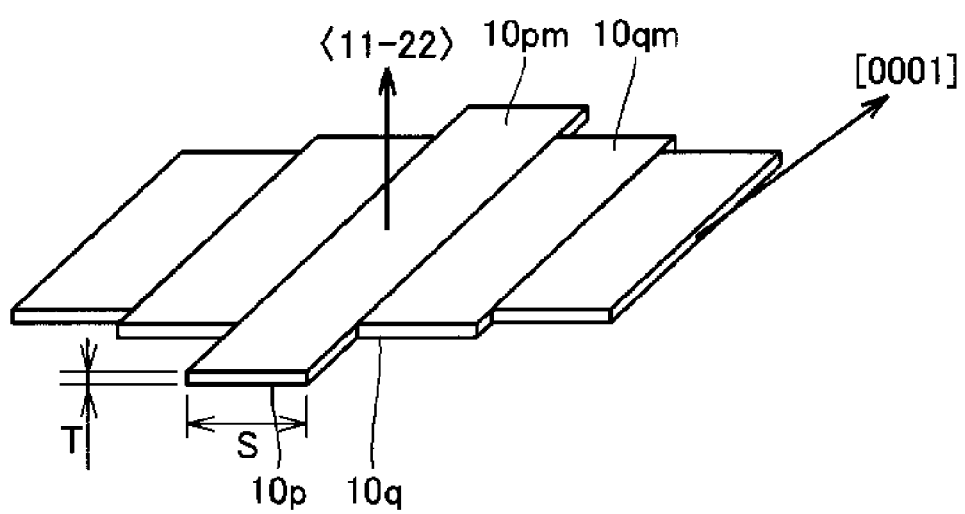
FIG. 7B, a schematic diagram for illustrating the further example of a III-nitride crystal manufacturing method involving the present invention, is an oblique perspective view summarily representing a process step of arranging substrates into a row.

Next, referring to FIG. 7B, these GaN crystal substrates were disposed adjoining each other sideways, in a manner such that the (11-22) major surfaces 10pm, 10qm of the plurality of GaN crystal substrates (III-nitride crystal substrates 10p, 10q) would be parallel to each other, and such that the [0001] directions in the GaN crystal substrates would be oriented in the same way. In this instance, the roughness average Ra of the adjoining faces 10pt, 10qt of the plurality of GaN crystal substrates was 5 nm.

Figure 7C:
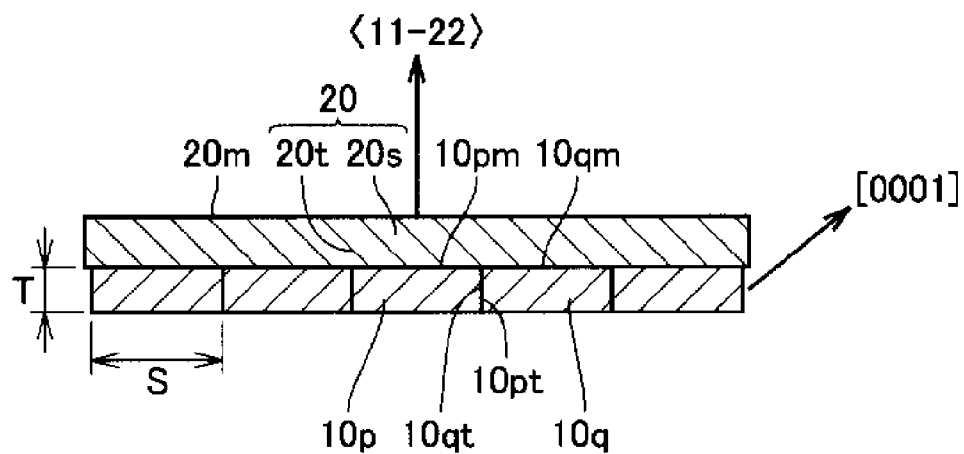
FIG. 7C, a schematic diagram for illustrating the further example of a III-nitride crystal manufacturing method involving the present invention, is a sectional view summarily representing a crystal-growth process step.

Next, with reference to FIG. 7C: The (11-22) major surfaces 10pm, 10qm of the situated plurality of GaN crystal substrates (III-nitride crystal substrates 10p, 10q) were processed in the same way as that of Embodiment 1, and thereafter GaN crystal (III-nitride crystal 20) was grown onto the major surfaces 10pm, 10qm under the same conditions as those of Embodiment 1.

The obtained GaN crystal, free of abnormal growth even in the adjoining-substrate supra-regions 20t, had a (11-22) major surface 20m. In an x-ray diffraction rocking-curve analysis of the (11-22) plane of the GaN crystal (III-nitride crystal 20), the direct-over-substrate regions 20s demonstrated diffraction peaks undivided in the tip, with the full-width at half-maximum being 90 arcsec. In the adjoining-substrate supra-regions 20t, meanwhile, diffraction peaks with divisions in the tip were demonstrated, with the full-width at half-maximum being 380 arcsec.

Furthermore, threading dislocation density in the (11-22) major surface 20m of the GaN crystal was $1 \times 10^7$ cm$^{-2}$ in the direct-over-substrate regions 20s, and $4 \times 10^7$ cm$^{-2}$ in the adjoining-substrate supra-regions 20t. In addition, the carrier concentration in the GaN crystal was $5 \times 10^{18}$ cm$^{-3}$, while the principal impurities were oxygen atoms and silicon atoms. The results are tabulated in Table I.

It should be understood that in Embodiment 6, the major-surface plane orientations of the plurality of GaN crystal substrates that were the surfaces onto which the GaN crystal was grown were all (11-22), in that although a few or more might have been (-2112), the crystallographic equivalent of (11-22), they would lead to the same results.

Embodiment 7

To begin with, referring to FIG. 7A, the (0001) face and (000-1) face—the two major surfaces—of GaN bulk crystal (III-nitride bulk crystal 1) were ground to bring the roughness average Ra of either major surface to 50 nm.

Next, again referring to FIG. 7A: The GaN bulk crystal (III-nitride bulk crystal 1) whose roughness average Ra on either of its major surfaces had been made 50 nm was sawed along a plurality of planes perpendicular to a <11-2-2> direction to slice off a plurality of GaN crystal substrates (III-nitride crystal substrates 10p, 10q) whose width S was 5 mm, length L was 20 to 50 mm, and thickness T was 1 mm, having {11-2-2} major surfaces. Subsequently, the six sides of each sliced-off GaN crystal substrate were ground and polished, to bring the roughness average Ra of the six surfaces to 5 nm. A plurality of GaN crystal substrates whose roughness average Ra on the {11-2-2} major surfaces was 5 nm was thus obtained. Among these GaN crystal substrates were GaN crystal substrates whose major-surface plane orientation did not coincide perfectly with {11-2-2}, but the plane orientation of the major surface of such GaN crystal substrates in all cases was misoriented by 5° or less with respect to {11-2-2}.

Figure 7D:
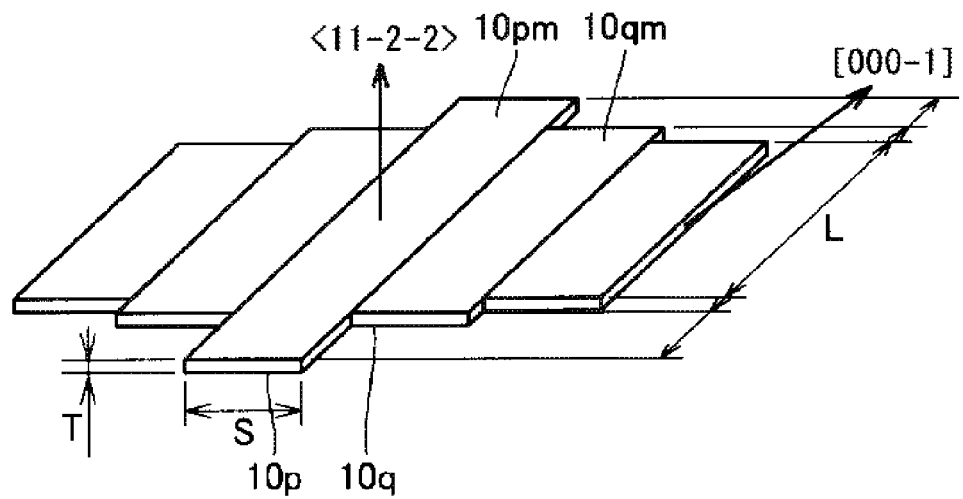
FIG. 7D, a schematic diagram for illustrating the further example of a III-nitride crystal manufacturing method involving the present invention, is an oblique perspective view summarily representing a process step of arranging substrates into a row.

Next, referring to FIG. 7D, these GaN crystal substrates were disposed adjoining each other sideways, in a manner such that the (11-2-2) major surfaces 10pm, 10qm of the plurality of GaN crystal substrates (III-nitride crystal substrates 10p, 10q) would be parallel to each other, and such that the [0001] directions in the GaN crystal substrates would be oriented in the same way. In this instance, the roughness average Ra of the adjoining faces 10pt, 10qt of the plurality of GaN crystal substrates was 5 nm.

Figure 7E:
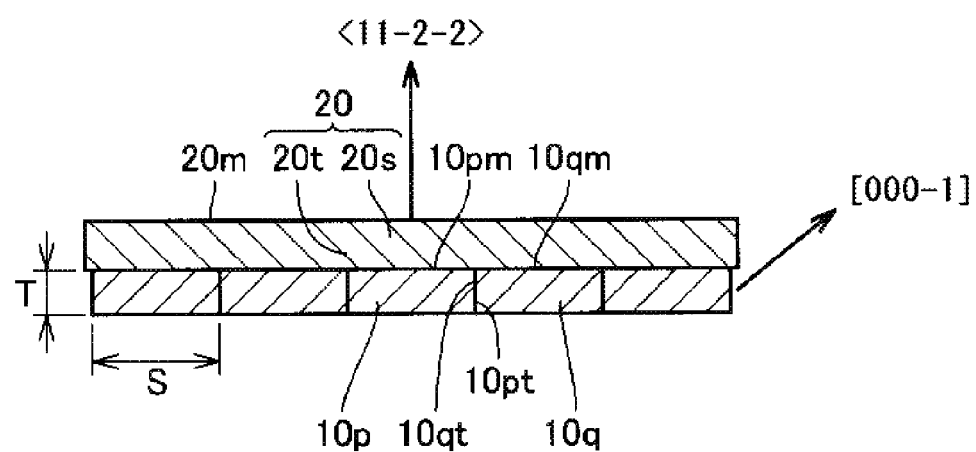
FIG. 7E, a schematic diagram for illustrating the further example of a III-nitride crystal manufacturing method involving the present invention, is a sectional view summarily representing a crystal-growth process step.

With reference now to FIG. 7E: Next, the (11-2-2) major surfaces 10pm, 10qm of the situated plurality of GaN crystal substrates (III-nitride crystal substrates 10p, 10q) were processed in the same way as that of Embodiment 1, and thereafter GaN crystal (III-nitride crystal 20) was grown onto the major surfaces 10pm, 10qm under the same conditions as those of Embodiment 1.

The obtained GaN crystal, free of abnormal growth even in the adjoining-substrate supra-regions 20t, had a (11-2-2) major surface 20m. In an x-ray diffraction rocking-curve analysis of the (11-2-2) plane of the GaN crystal (III-nitride crystal 20), the direct-over-substrate regions 20s demonstrated diffraction peaks undivided in the tip, with the full-width at half-maximum being 80 arcsec. In the adjoining-substrate supra-regions 20t, meanwhile, diffraction peaks with divisions in the tip were demonstrated, with the full-width at half-maximum being 360 arcsec.

Furthermore, threading dislocation density in the (11-2-2) major surface 20*m* of the GaN crystal was $1 \times 10^7$ cm$^{-2}$ in the direct-over-substrate regions 20*s*, and $4 \times 10^7$ cm$^{-2}$ in the adjoining-substrate supra-regions 20*t*. In addition, the carrier concentration in the GaN crystal was $5 \times 10^{18}$ cm$^{-3}$, while the principal impurities were oxygen atoms and silicon atoms. The results are tabulated in Table I.

It should be understood that in Embodiment 7, the major-surface plane orientations of the plurality of GaN crystal substrates that were the surfaces onto which the GaN crystal was grown were all (11-2-2), in that although a few or more might have been (-211-2), the crystallographic equivalent of (11-2-2), they would lead to the same results.

Embodiment 8

Figure 8A:
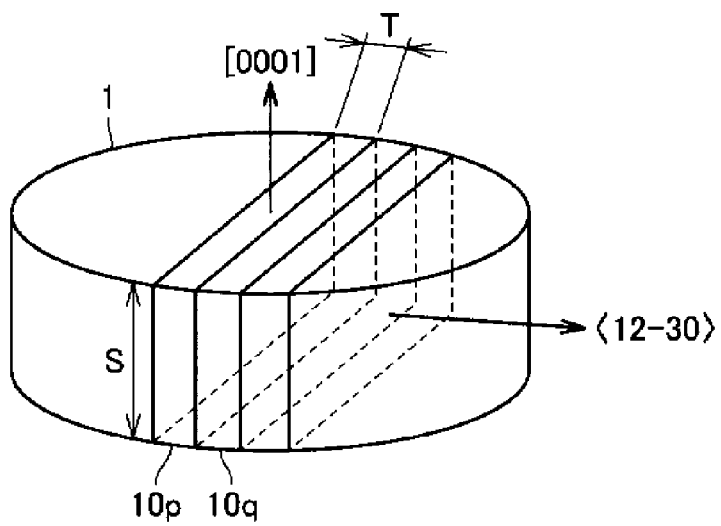
FIG. 8A, a schematic diagram for illustrating a still further example of a III-nitride crystal manufacturing method involving the present invention, is an oblique perspective view summarily representing a process step of slicing off substrates.

To begin with, referring to FIG. 8A, the (0001) face and (000-1) face—the two major surfaces—of GaN bulk crystal (III-nitride bulk crystal 1) were ground and polished to bring the roughness average Ra of either major surface to 5 nm.

Next, again referring to FIG. 8A: The GaN bulk crystal (III-nitride bulk crystal 1) whose roughness average Ra on either of its major surfaces had been made 5 nm was sawed along a plurality of planes perpendicular to a <12-30> direction to slice off a plurality of GaN crystal substrates (III-nitride crystal substrates 10*p*, 10*q*) whose width S was 3 mm, length L was 20 to 50 mm, and thickness T was 1 mm, having {12-30} major surfaces. Subsequently, the not-ground and not-polished four sides of each sliced-off GaN crystal substrate were ground and polished, to bring the roughness average Ra of the four surfaces to 5 nm. A plurality of GaN crystal substrates whose roughness average Ra on the {12-30} major surfaces was 5 nm was thus obtained. Among these GaN crystal substrates were GaN crystal substrates whose major-surface plane orientation did not coincide perfectly with {12-30}, but the plane orientation of the major surface of such GaN crystal substrates in all cases was misoriented by 5° or less with respect to {12-30}.

Figure 8B:
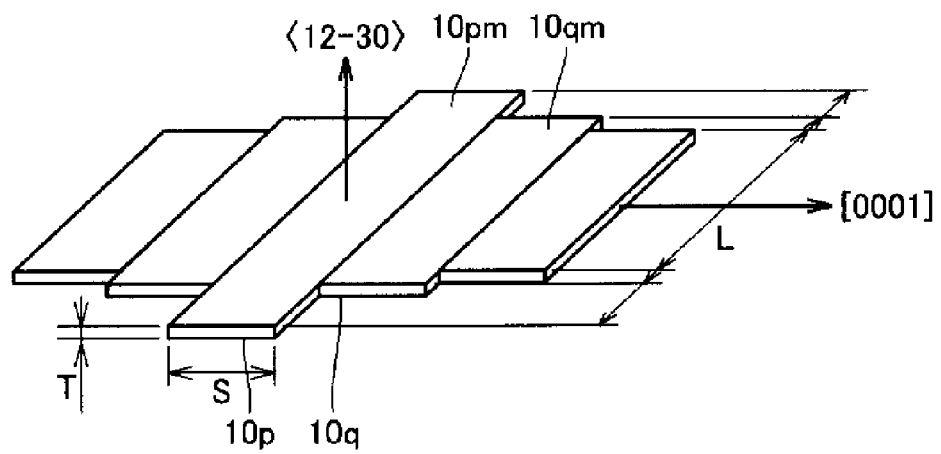
FIG. 8B, a schematic diagram for illustrating the still further example of a III-nitride crystal manufacturing method involving the present invention, is an oblique perspective view summarily representing a process step of arranging substrates into a row.
Figure 8C:
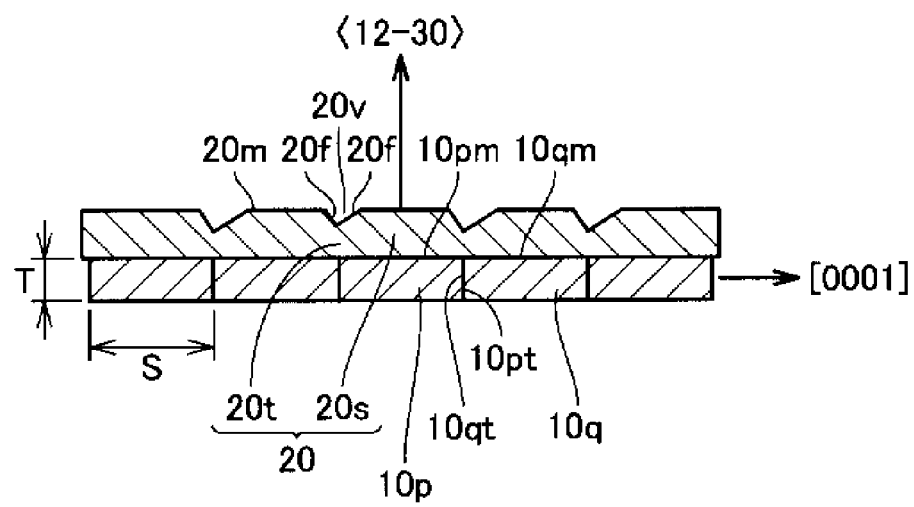
FIG. 8C, a schematic diagram for illustrating the still further example of a III-nitride crystal manufacturing method involving the present invention, is a sectional view summarily representing a crystal-growth process step.

Next, referring to FIG. 8B, these GaN crystal substrates were disposed adjoining each other sideways, in a manner such that the (12-30) major surfaces 10*pm*, 10*qm* of the plurality of GaN crystal substrates (III-nitride crystal substrates 10*p*, 10*q*) would be parallel to each other, and such that the [0001] directions in the GaN crystal substrates would be oriented in the same way. In this instance, referring also to FIG. 8C, the roughness average Ra of the adjoining faces 10*pt*, 10*qt* of the plurality of GaN crystal substrates was 5 nm.

Next, with reference again to FIG. 8C: The (12-30) major surfaces 10*pm*, 10*qm* of the situated plurality of GaN crystal substrates (III-nitride crystal substrates 10*p*, 10*q*) were processed in the same way as that of Embodiment 1, and thereafter GaN crystal (III-nitride crystal 20) was grown onto the major surfaces 10*pm*, 10*qm* under the same conditions as those of Embodiment 1.

The obtained GaN crystal (III-nitride crystal 20) had a (12-30) major surface 20*m* in which pits 20*v* constituted by a plurality of facets 20*f* were formed in the adjoining-substrate supra-regions 20*t*. Further, in an x-ray diffraction rocking-curve analysis of the (12-30) plane of the GaN crystal (III-nitride crystal 20), the direct-over-substrate regions 20*s* demonstrated diffraction peaks undivided in the tip, with the full-width at half-maximum being 280 arcsec. In the adjoining-substrate supra-regions 20*t*, meanwhile, diffraction peaks with divisions in the tip were demonstrated, with the full-width at half-maximum being 660 arcsec.

Furthermore, threading dislocation density in the (12-30) major surface 20*m* of the GaN crystal was $1 \times 10^7$ cm$^{-2}$ in the direct-over-substrate regions 20*s*, and $7 \times 10^7$ cm$^{-2}$ in the adjoining-substrate supra-regions 20*t*. In addition, the carrier concentration in the GaN crystal was $4 \times 10^{18}$ cm$^{-3}$, while the principal impurities were oxygen atoms and silicon atoms. The results are tabulated in Table I.

It should be understood that in Embodiment 8, the major-surface plane orientations of the plurality of GaN crystal substrates that were the surfaces onto which the GaN crystal was grown were all (12-30), in that although a few or more might have been (-3210), the crystallographic equivalent of (12-30), they would lead to the same results.

Embodiment 9

Figure 9A:
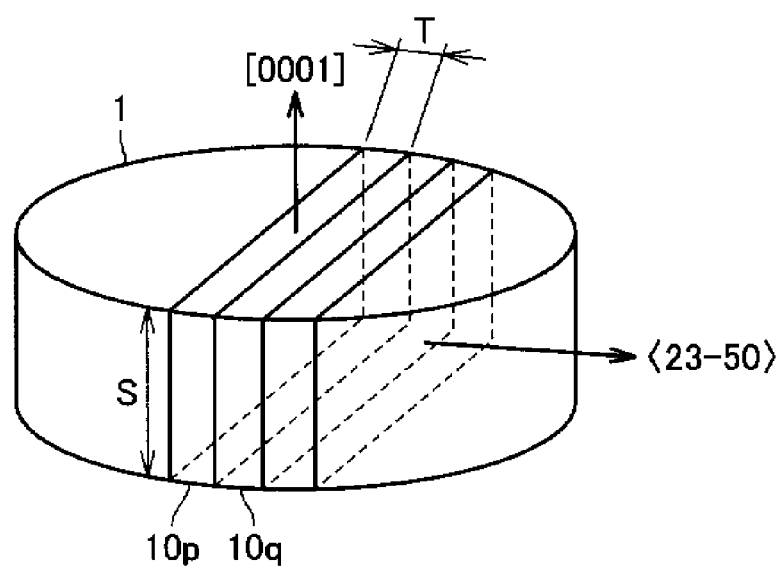
FIG. 9A, a schematic diagram for illustrating a yet further example of a III-nitride crystal manufacturing method involving the present invention, is an oblique perspective view summarily representing a process step of slicing off substrates.

To begin with, referring to FIG. 9A, the (0001) face and (000-1) face—the two major surfaces—of GaN bulk crystal (III-nitride bulk crystal 1) were ground and polished to bring the roughness average Ra of either major surface to 5 nm.

Next, again referring to FIG. 9A: The GaN bulk crystal (III-nitride bulk crystal 1) whose roughness average Ra on either of its major surfaces had been made 5 nm was sawed along a plurality of planes perpendicular to a <23-50> direction to slice off a plurality of GaN crystal substrates (III-nitride crystal substrates 10*p*, 10*q*) whose width S was 3 mm, length L was 20 to 50 mm, and thickness T was 1 mm, having {23-50} major surfaces. Subsequently, the not-ground and not-polished four sides of each sliced-off GaN crystal substrate were ground and polished, to bring the roughness average Ra of the four surfaces to 5 nm. A plurality of GaN crystal substrates whose roughness average Ra on the {23-50} major surfaces was 5 nm was thus obtained. Among these GaN crystal substrates were GaN crystal substrates whose major-surface plane orientation did not coincide perfectly with {23-50}, but the plane orientation of the major surface of such GaN crystal substrates in all cases was misoriented by 5° or less with respect to {23-50}.

Figure 9B:
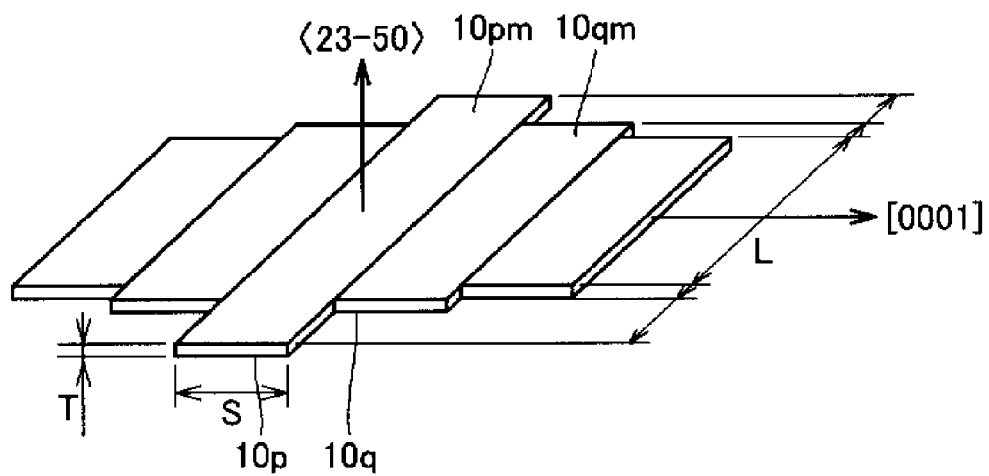
FIG. 9B, a schematic diagram for illustrating the yet further example of a III-nitride crystal manufacturing method involving the present invention, is an oblique perspective view summarily representing a process step of arranging substrates into a row.

Next, referring to FIG. 9B, these GaN crystal substrates were disposed adjoining each other sideways, in a manner such that the (23-50) major surfaces 10*pm*, 10*qm* of the plurality of GaN crystal substrates (III-nitride crystal substrates 10*p*, 10*q*) would be parallel to each other, and such that the [0001] directions in the GaN crystal substrates would be oriented in the same way. In this instance, the roughness average Ra of the adjoining faces 10*pt*, 10*qt* of the plurality of GaN crystal substrates was 5 nm.

Figure 9C:
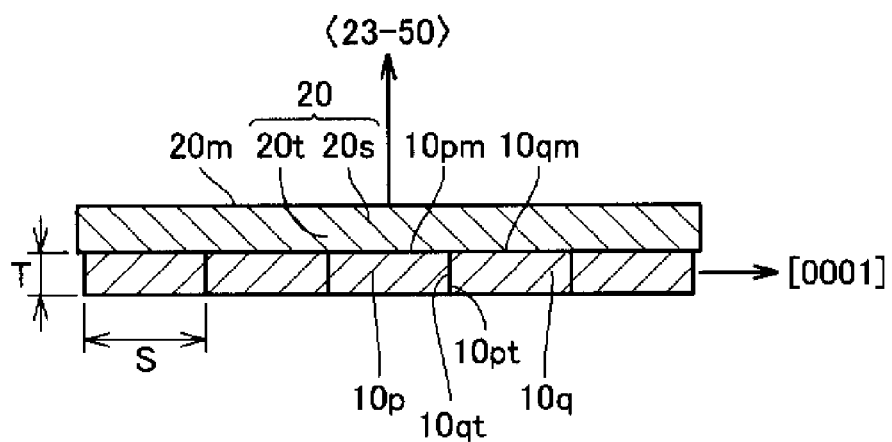
FIG. 9C, a schematic diagram for illustrating the yet further example of a III-nitride crystal manufacturing method involving the present invention, is a sectional view summarily representing a crystal-growth process step.

With reference now to FIG. 9C: Next, GaN crystal (III-nitride crystal 20) was deposited by flux growth onto the (23-50) major surfaces 10*pm*, 10*qm* of the situated plurality of GaN crystal substrates (III-nitride crystal substrates 10*p*, 10*q*). Specifically, a Ga—Na melt (a liquefied mixture of Ga and Na) was contacted on the (23-50) major surfaces 10*pm*, 10*qm* of the plurality of GaN crystal substrates, and under crystal-growth temperature and crystal-growth pressure (gaseous-nitrogen pressure) conditions of 870° C. and 4 MPa (40 atmospheres), GaN crystal (III-nitride crystal 20) was grown onto the (23-50) major surfaces 10*pm*, 10*qm* of the GaN crystal substrates for 100 hours at a deposition rate of 5 μm/hr.

The obtained GaN crystal, free of abnormal growth even in the adjoining-substrate supra-regions 20*t*, had a (23-50) major surface 20*m*. In an x-ray diffraction rocking-curve analysis of the (23-50) plane of the GaN crystal (III-nitride crystal 20), the direct-over-substrate regions 20*s* demonstrated diffraction peaks undivided in the tip, with the full-width at half-maximum being 230 arcsec. In the adjoining-substrate supra-regions 20*t*, meanwhile, diffraction peaks with divisions in the tip were demonstrated, with the full-width at half-maximum being 490 arcsec.

Furthermore, threading dislocation density in the (23-50) major surface 20*m* of the GaN crystal was $1 \times 10^7$ cm$^{-2}$ in the direct-over-substrate regions 20s, and 4×10⁷ cm⁻² in the adjoining-substrate supra-regions 20t. In addition, the carrier concentration in the GaN crystal was 3×10¹⁸ cm⁻³, while the principal impurities were oxygen atoms and silicon atoms. The results are tabulated in Table I.

It should be understood that in Embodiment 9, the plane orientations of the major surfaces 10pm, 10qm of the plurality of GaN crystal substrates that were the surfaces onto which the GaN crystal was grown were all (23-50), in that although a few or more might have been (-5230), the crystallographic equivalent of (23-50), they would lead to the same results.

Embodiment 10

Figure 10A:
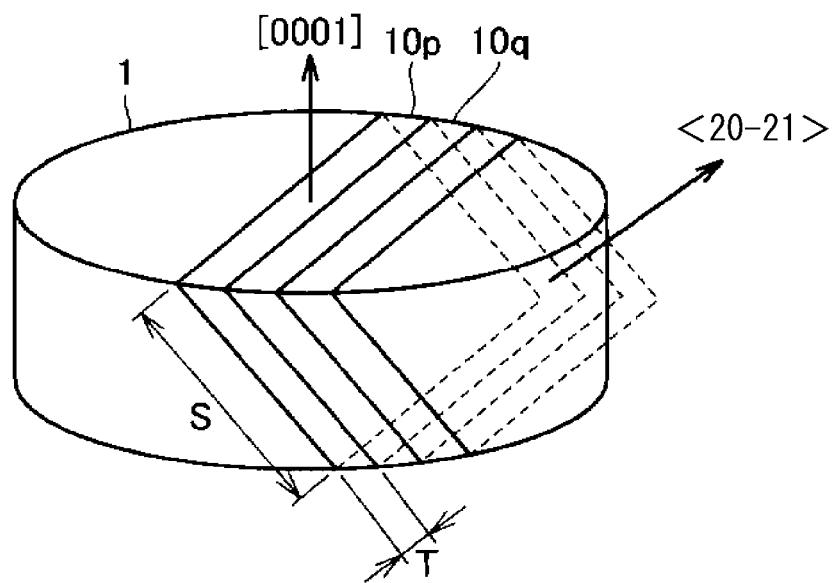
FIG. 10A, a schematic diagram for illustrating an even further example of a III-nitride crystal manufacturing method involving the present invention, is an oblique perspective view summarily representing a process step of slicing off substrates.

To begin with, referring to FIG. 10A, the (0001) face and (000-1) face—the two major surfaces—of GaN bulk crystal (III-nitride bulk crystal 1) were ground and polished to bring the roughness average Ra of either major surface to 5 nm.

Next, again referring to FIG. 10A: The GaN bulk crystal (III-nitride bulk crystal 1) whose roughness average Ra on either of its major surfaces had been made 5 nm was sawed along a plurality of planes perpendicular to a <20-21> direction to slice off a plurality of GaN crystal substrates (III-nitride crystal substrates 10p, 10q) whose width S was 3 mm, length L was 20 to 50 mm, and thickness T was 1 mm, having {20-21} major surfaces. Subsequently, the not-ground and not-polished four sides of each sliced-off GaN crystal substrate were ground and polished, to bring the roughness average Ra of the four surfaces to 5 nm. A plurality of GaN crystal substrates whose roughness average Ra on the {20-21} major surfaces was 5 nm was thus obtained. Among these GaN crystal substrates were GaN crystal substrates whose major-surface plane orientation did not coincide perfectly with {20-21}, but the plane orientation of the major surface of such GaN crystal substrates in all cases was misoriented by 5° or less with respect to {20-21}.

Figure 10B:
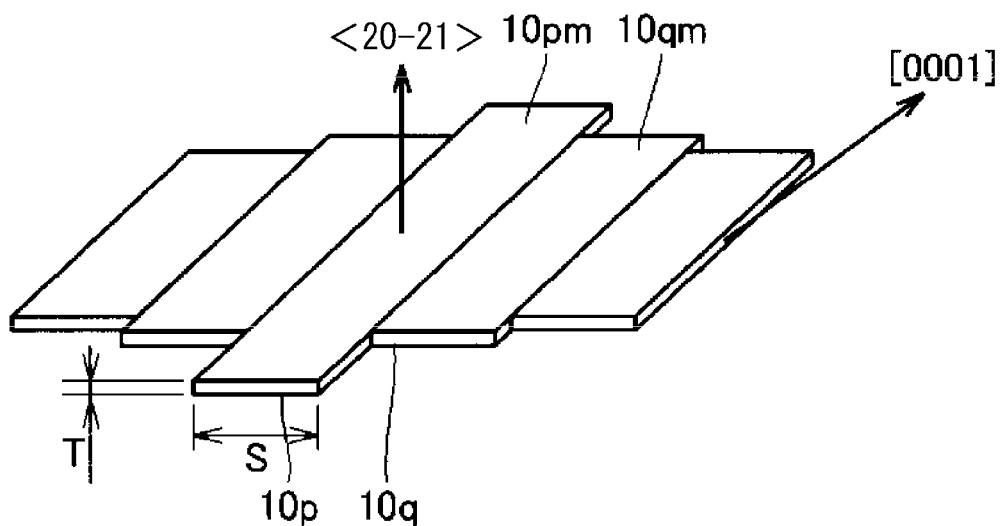
FIG. 10B, a schematic diagram for illustrating the even further example of a III-nitride crystal manufacturing method involving the present invention, is an oblique perspective view summarily representing a process step of arranging substrates into a row.
Figure 10C:
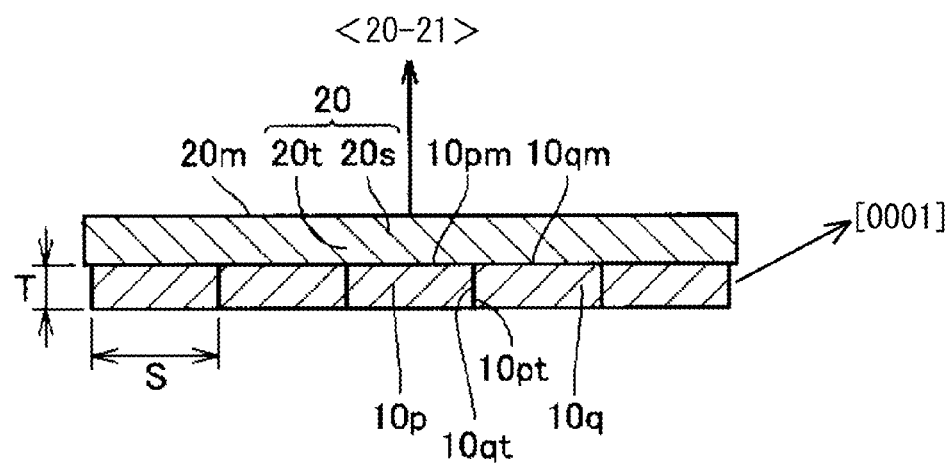
FIG. 10C, a schematic diagram for illustrating the even further example of a III-nitride crystal manufacturing method involving the present invention, is a sectional view summarily representing a crystal-growth process step.

Next, referring to FIG. 10B, these GaN crystal substrates were disposed adjoining each other sideways, in a manner such that the (20-21) major surfaces 10pm, 10qm of the plurality of GaN crystal substrates (III-nitride crystal substrates 10p, 10q) would be parallel to each other, and such that the [0001] directions in the GaN crystal substrates would be oriented in the same way. In this instance, referring also to FIG. 10C, the roughness average Ra of the adjoining faces 10pt, 10qt of the plurality of GaN crystal substrates was 5 nm.

Next, with reference again to FIG. 10C: The (20-21) major surfaces 10pm, 10qm of the situated plurality of GaN crystal substrates (III-nitride crystal substrates 10p, 10q) were processed in the same way as that of Embodiment 1, and thereafter GaN crystal (III-nitride crystal 20) was grown onto the major surfaces 10pm, 10qm under the same conditions as those of Embodiment 1.

The obtained GaN crystal, free of abnormal growth even in the adjoining-substrate supra-regions 20t, had a (20-21) major surface 20m. In an x-ray diffraction rocking-curve analysis of the (20-21) plane of the GaN crystal (III-nitride crystal 20), the direct-over-substrate regions 20s demonstrated diffraction peaks undivided in the tip, with the full-width at half-maximum being 120 arcsec. In the adjoining-substrate supra-regions 20t, meanwhile, diffraction peaks that with divisions in the tip were demonstrated, with the full-width at half-maximum being 380 arcsec.

Furthermore, threading dislocation density in the (20-21) major surface 20m of the GaN crystal was 1×10⁷ cm⁻² in the direct-over-substrate regions 20s, and 4×10⁷ cm⁻² in the adjoining-substrate supra-regions 20t. In addition, the carrier concentration in the GaN crystal was 1×10¹⁸ cm⁻³, while the principal impurities were oxygen atoms and silicon atoms. The results are tabulated in Table I.

It should be understood that in Embodiment 10, the major-surface plane orientations of the plurality of GaN crystal substrates that were the surfaces onto which the GaN crystal was grown were all (20-21), in that although a few or more might have been (-2021), the crystallographic equivalent of (20-21), they would lead to the same results.

Embodiment 11

To begin with, referring to FIG. 10A, the (0001) face and (000-1) face—the two major surfaces—of GaN bulk crystal (III-nitride bulk crystal 1) were ground and polished to bring the roughness average Ra of either major surface to 5 nm.

Next, again referring to FIG. 10A: The GaN bulk crystal (III-nitride bulk crystal 1) whose roughness average Ra on either of its major surfaces had been made 5 nm was sawed along a plurality of planes perpendicular to a <20-2-1> direction to slice off a plurality of GaN crystal substrates (III-nitride crystal substrates 10p, 10q) whose width S was 3 mm, length L was 20 to 50 mm, and thickness T was 1 mm, having {20-2-1} major surfaces. Subsequently, the not-ground and not-polished four sides of each sliced-off GaN crystal substrate were ground and polished, to bring the roughness average Ra of the four surfaces to 5 nm. A plurality of GaN crystal substrates whose roughness average Ra on the {20-2-1} major surfaces was 5 nm was thus obtained. Among these GaN crystal substrates were GaN crystal substrates whose major-surface plane orientation did not coincide perfectly with {20-2-1}, but the plane orientation of the major surface of such GaN crystal substrates in all cases was misoriented by 5° or less with respect to {20-2-1}.

Figure 10D:
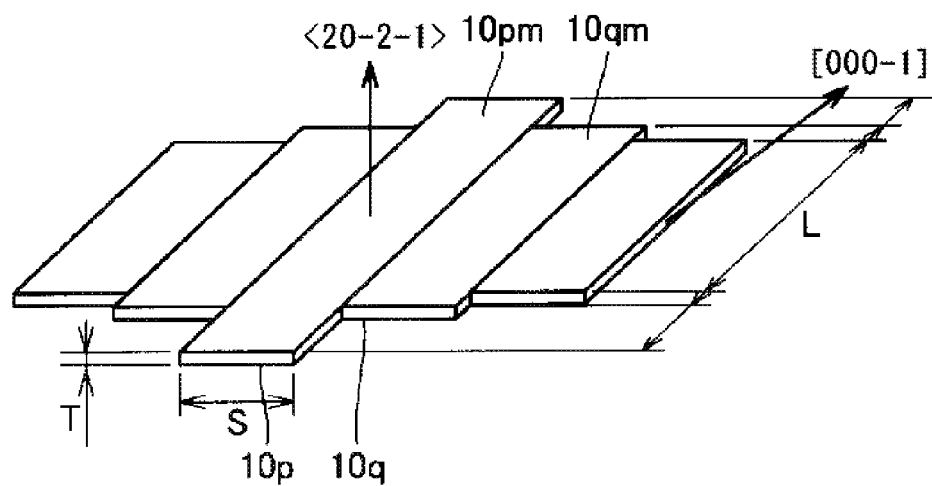
FIG. 10D, a schematic diagram for illustrating the even further example of a III-nitride crystal manufacturing method involving the present invention, is an oblique perspective view summarily representing a process step of arranging substrates into a row.

Next, referring to FIG. 10D, these GaN crystal substrates were disposed adjoining each other sideways, in a manner such that the (20-2-1) major surfaces 10pm, 10qm of the plurality of GaN crystal substrates (III-nitride crystal substrates 10p, 10q) would be parallel to each other, and such that the [0001] directions in the GaN crystal substrates would be oriented in the same way. In this instance, referring also to FIG. 10C, the roughness average Ra of the adjoining faces 10pt, 10qt of the plurality of GaN crystal substrates was 5 nm.

Figure 10E:
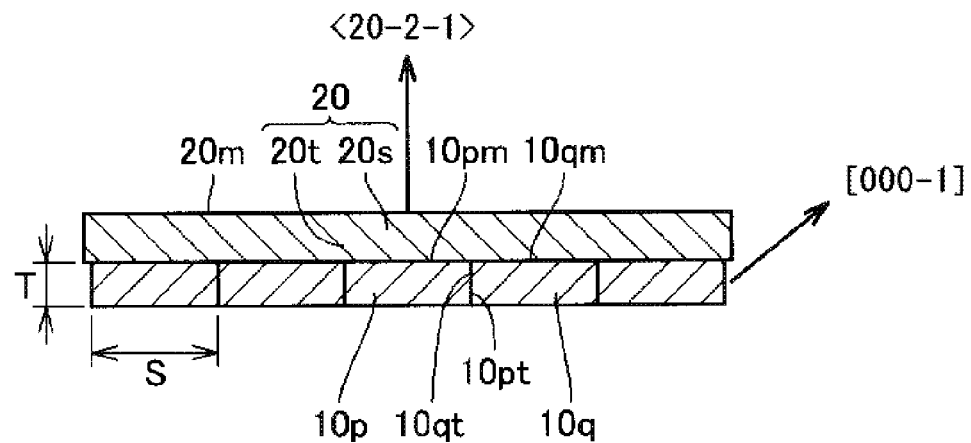
FIG. 10E, a schematic diagram for illustrating the even further example of a III-nitride crystal manufacturing method involving the present invention, is a sectional view summarily representing a crystal-growth process step.

With reference now to FIG. 10E: Next, the (20-2-1) major surfaces 10pm, 10qm of the situated plurality of GaN crystal substrates (III-nitride crystal substrates 10p, 10q) were processed in the same way as that of Embodiment 1, and thereafter GaN crystal (III-nitride crystal 20) was grown onto the major surfaces 10pm, 10qm under the same conditions as those of Embodiment 1.

The obtained GaN crystal, free of abnormal growth even in the adjoining-substrate supra-regions 20t, had a (20-2-1) major surface 20m. In an x-ray diffraction rocking-curve analysis of the (20-2-1) plane of the GaN crystal (III-nitride crystal 20), the direct-over-substrate regions 20s demonstrated diffraction peaks undivided in the tip, with the full-width at half-maximum being 90 arcsec. In the adjoining-substrate supra-regions 20t, meanwhile, diffraction peaks with divisions in the tip were demonstrated, with the full-width at half-maximum being 360 arcsec.

Furthermore, threading dislocation density in the (20-2-1) major surface 20m of the GaN crystal was 1×10⁷ cm⁻² in the direct-over-substrate regions 20s, and 4×10⁷ cm⁻² in the adjoining-substrate supra-regions 20t. In addition, the carrier concentration in the GaN crystal was 1×10¹⁸ cm⁻³, while the principal impurities were oxygen atoms and silicon atoms. The results are tabulated in Table I.

It should be understood that in Embodiment 11, the major-surface plane orientations of the plurality of GaN crystal substrates that were the surfaces onto which the GaN crystal was grown were all (20-2-1), in that although a few or more might have been (−202−1), the crystallographic equivalent of (20-2−1), they would lead to the same results.

Embodiment 12

Figure 11A:
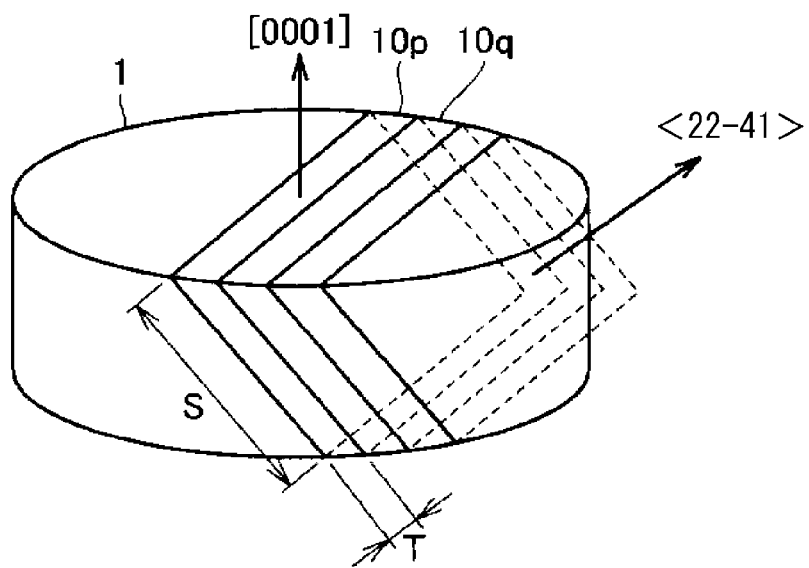
FIG. 11A, a schematic diagram for illustrating a yet even further example of a III-nitride crystal manufacturing method involving the present invention, is an oblique perspective view summarily representing a process step of slicing off substrates.

To begin with, referring to FIG. 11A, the (0001) face and (000-1) face—the two major surfaces—of GaN bulk crystal (III-nitride bulk crystal 1) were ground and polished to bring the roughness average Ra of either major surface to 5 nm.

Next, again referring to FIG. 11A: The GaN bulk crystal (III-nitride bulk crystal 1) whose roughness average Ra on either of its major surfaces had been made 5 nm was sawed along a plurality of planes perpendicular to a <22-41> direction to slice off a plurality of GaN crystal substrates (III-nitride crystal substrates $10p$, $10q$) whose width S was 3 mm, length L was 20 to 50 mm, and thickness T was 1 mm, having {22-41} major surfaces. Subsequently, the not-ground and not-polished four sides of each sliced-off GaN crystal substrate were ground and polished, to bring the roughness average Ra of the four surfaces to 5 nm. A plurality of GaN crystal substrates whose roughness average Ra on the {22-41} major surfaces was 5 nm was thus obtained. Among these GaN crystal substrates were GaN crystal substrates whose major-surface plane orientation did not coincide perfectly with {22-41}, but the plane orientation of the major surface of such GaN crystal substrates in all cases was misoriented by 5° or less with respect to {22-41}.

Figure 11B:
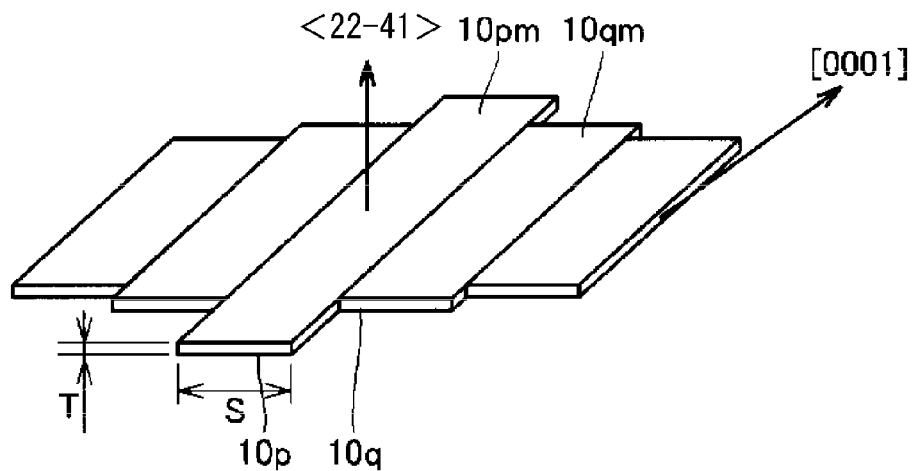
FIG. 11B, a schematic diagram for illustrating the yet even further example of a III-nitride crystal manufacturing method involving the present invention, is an oblique perspective view summarily representing a process step of arranging substrates into a row.
Figure 11C:
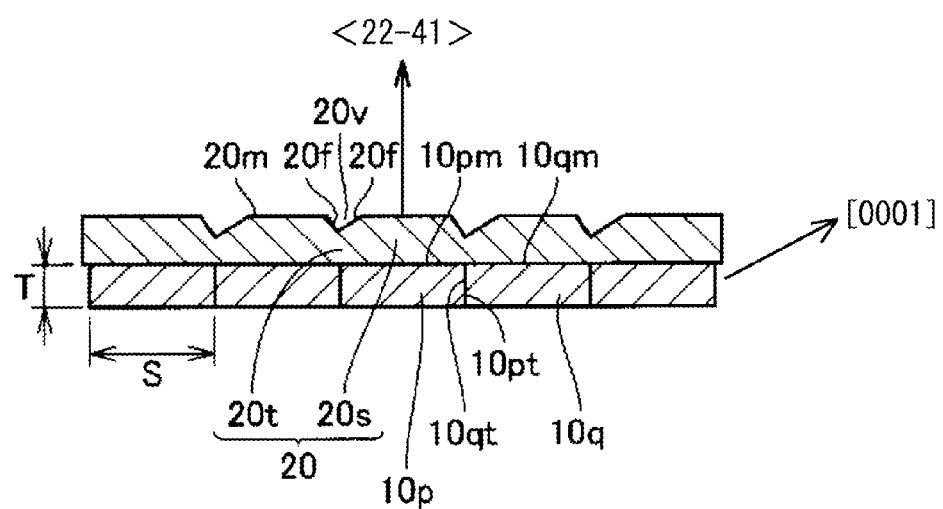
FIG. 11C, a schematic diagram for illustrating the yet even further example of a III-nitride crystal manufacturing method involving the present invention, is a sectional view summarily representing a crystal-growth process step.

Next, referring to FIG. 11B, these GaN crystal substrates were disposed adjoining each other sideways, in a manner such that the (22-41) major surfaces $10pm$, $10qm$ of the plurality of GaN crystal substrates (III-nitride crystal substrates $10p$, $10q$) would be parallel to each other, and such that the [0001] directions in the GaN crystal substrates would be oriented in the same way. In this instance, referring also to FIG. 11C, the roughness average Ra of the adjoining faces $10pt$, $10qt$ of the plurality of GaN crystal substrates was 5 nm.

Next, with reference again to FIG. 11C: The (22-41) major surfaces $10pm$, $10qm$ of the situated plurality of GaN crystal substrates (III-nitride crystal substrates $10p$, $10q$) were processed in the same way as that of Embodiment 1, and thereafter GaN crystal (III-nitride crystal 20) was grown onto the major surfaces $10pm$, $10qm$ under the same conditions as those of Embodiment 1.

The obtained GaN crystal (III-nitride crystal 20) had a (22-41) major surface $20m$ in which pits $20v$ defined by a plurality of facets $20f$ were formed in the adjoining-substrate supra-regions $20t$. Further, in an x-ray diffraction rocking-curve analysis of the (22-41) plane of the GaN crystal (III-nitride crystal 20), the direct-over-substrate regions $20s$ demonstrated diffraction peaks undivided in the tip, with the full-width at half-maximum being 220 arcsec. In the adjoining-substrate supra-regions $20t$, meanwhile, diffraction peaks with divisions in the tip were demonstrated, with the full-width at half-maximum being 580 arcsec.

Furthermore, threading dislocation density in the (22-41) major surface $20m$ of the GaN crystal was $3\times10^7$ cm$^{-2}$ in the direct-over-substrate regions $20s$, and $7\times10^7$ cm$^{-2}$ in the adjoining-substrate supra-regions $20t$. In addition, the carrier concentration in the GaN crystal was $2\times10^{18}$ cm$^{-3}$, while the principal impurities were oxygen atoms and silicon atoms. The results are tabulated in Table I.

It should be understood that in Embodiment 12, the major-surface plane orientations of the plurality of GaN crystal substrates that were the surfaces onto which the GaN crystal was grown were all (22-41), in that although a few or more might have been (−4221), the crystallographic equivalent of (22-41), they would lead to the same results.

Embodiment 13

To begin with, referring to FIG. 11A, the (0001) face and (000-1) face—the two major surfaces—of GaN bulk crystal (III-nitride bulk crystal 1) were ground and polished to bring the roughness average Ra of either major surface to 5 nm.

Next, again referring to FIG. 11A: The GaN bulk crystal (III-nitride bulk crystal 1) whose roughness average Ra on either of its major surfaces had been made 5 nm was sawed along a plurality of planes perpendicular to a <22-4-1> direction to slice off a plurality of GaN crystal substrates (III-nitride crystal substrates $10p$, $10q$) whose width S was 3 mm, length L was 20 to 50 mm, and thickness T was 1 mm, having {22-4-1} major surfaces. Subsequently, the not-ground and not-polished four sides of each sliced-off GaN crystal substrate were ground and polished, to bring the roughness average Ra of the four surfaces to 5 nm. A plurality of GaN crystal substrates whose roughness average Ra on the {22-4-1} major surfaces was 5 nm was thus obtained. Among these GaN crystal substrates were GaN crystal substrates whose major-surface plane orientation did not coincide perfectly with {22-4-1}, but the plane orientation of the major surface of such GaN crystal substrates in all cases was misoriented by 5° or less with respect to {22-4-1}.

Figure 11D:
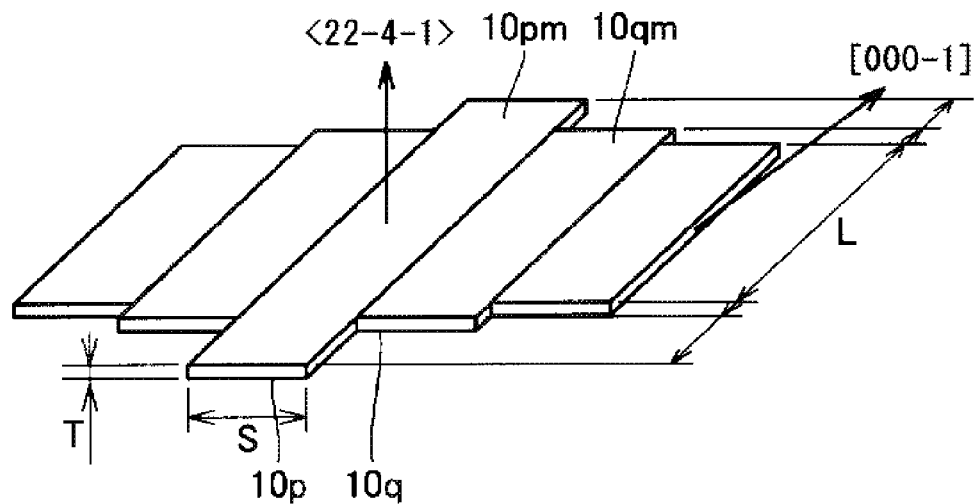
FIG. 11D, an schematic diagram for illustrating the yet even further example of a III-nitride crystal manufacturing method involving the present invention, is an perspective view summarily representing a process step of arranging substrates into a row.

Next, referring to FIG. 11D, these GaN crystal substrates were disposed adjoining each other sideways, in a manner such that the (22-4-1) major surfaces $10pm$, $10qm$ of the plurality of GaN crystal substrates (III-nitride crystal substrates $10p$, $10q$) would be parallel to each other, and such that the [0001] directions in the GaN crystal substrates would be conformed. In this instance, referring also to FIG. 11C, the roughness average Ra of the adjoining faces $10pt$, $10qt$ of the plurality of GaN crystal substrates was 5 nm.

Figure 11E:
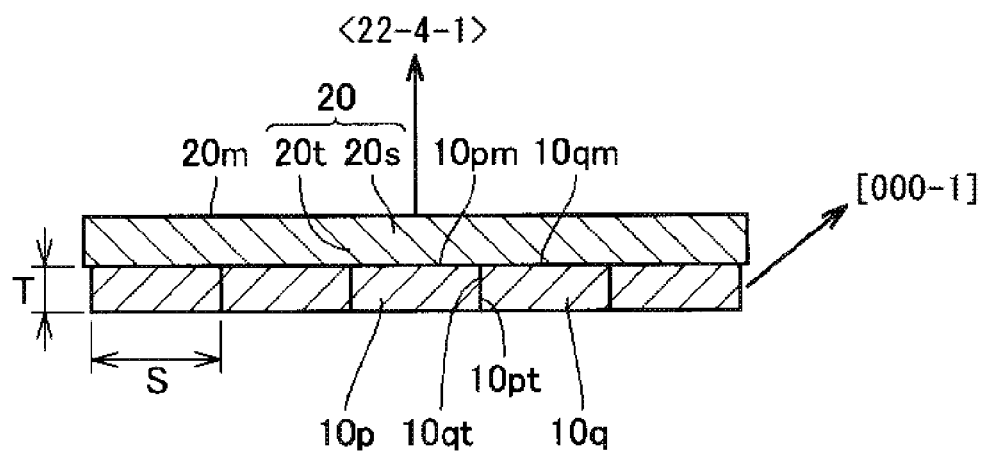
FIG. 11E, a schematic diagram for illustrating the yet even further example of a III-nitride crystal manufacturing method involving the present invention, is a sectional view summarily representing a crystal-growth process step.

With reference now to FIG. 11E: Next, the (22-4-1) major surfaces $10pm$, $10qm$ of the situated plurality of GaN crystal substrates (III-nitride crystal substrates $10p$, $10q$) were processed in the same way as that of Embodiment 1, and thereafter GaN crystal (III-nitride crystal 20) was grown onto the major surfaces $10pm$, $10qm$ under the same conditions as those of Embodiment 1.

The obtained GaN crystal (III-nitride crystal 20) had a (22-4-1) major surface $20m$ in which pits $20v$ defined by a plurality of facets $20f$ were formed in the adjoining-substrate supra-regions $20t$. Further, in an x-ray diffraction rocking-curve analysis of the (22-4-1) plane of the GaN crystal (III-nitride crystal 20), the direct-over-substrate regions $20s$ demonstrated diffraction peaks undivided in the tip, with the full-width at half-maximum being 200 arcsec. In the adjoining-substrate supra-regions $20t$, meanwhile, diffraction peaks with divisions in the tip were demonstrated, with the full-width at half-maximum being 480 arcsec.

Furthermore, threading dislocation density in the (22-4-1) major surface $20m$ of the GaN crystal was $3\times10^7$ cm$^{-2}$ in the direct-over-substrate regions $20s$, and $7\times10^7$ cm$^{-2}$ in the adjoining-substrate supra-regions $20t$. In addition, the carrier concentration in the GaN crystal was $2\times10^{18}$ cm$^{-3}$, while the principal impurities were oxygen atoms and silicon atoms. The results are tabulated in Table I.

It should be understood that in Embodiment 13, the major-surface plane orientations of the plurality of GaN crystal substrates that were the surfaces onto which the GaN crystal was grown were all (22-4-1), in that although a few or more might have been (−422-1), the crystallographic equivalent of (22-4-1), they would lead to the same results.

TABLE I

|  |  | Emb. 1 | Emb. 2 | Emb. 3 | Emb. 4 | Emb. 5 | Emb. 6 | Emb. 7 |
| --- | --- | --- | --- | --- | --- | --- | --- | --- |
| III-Nitride crystal substrate | Substrate type | GaN | GaN | GaN | GaN | GaN | GaN | GaN |
|  | Major-surface plane orient. | $(1\bar{1}00)$ | $(1\bar{1}00)$ | $(11\bar{2}0)$ | $(1\bar{1}02)$ | $(1\bar{1}0\bar{2})$ | $(11\bar{2}2)$ | $(11\bar{2}\bar{2})$ |
|  | Major-surface roughness Ra (nm) | 5 | 5 | 5 | 5 | 5 | 5 | 5 |
|  | Adjoining-surface roughness Ra (nm) | 5 | 50 | 5 | 5 | 5 | 5 | 5 |
| III-Nitride crystal | Crystal type | GaN | GaN | GaN | GaN | GaN | GaN | GaN |
|  | Crystal growth method | HVPE | HVPE | HVPE | HVPE | HVPE | HVPE | HVPE |
|  | Crystal growth temperature (° C.) | 1050 | 1050 | 1050 | 1050 | 1050 | 1050 | 1050 |
|  | Major-surface plane orient. | $(1\bar{1}00)$ | $(1\bar{1}00)$ | $(11\bar{2}0)$ | $(1\bar{1}02)$ | $(1\bar{1}0\bar{2})$ | $(11\bar{2}2)$ | $(11\bar{2}\bar{2})$ |
|  | Pits present in major surface? | No | Yes | Yes | No | No | No | No |
|  | X-ray diff. peak FWHM (arcsec) Direct-over-subst. region | 100 | 100 | 250 | 120 | 100 | 90 | 80 |
|  | X-ray diff. peak FWHM (arcsec) Adjoin.-sub. supra-region | 300 | 800 | 620 | 480 | 420 | 380 | 360 |
|  | Major-surface thread. disloc. dens. (cm$^{-2}$) Direct-over-subst. region | $1 \times 10^7$ | $1 \times 10^7$ | $1 \times 10^7$ | $1 \times 10^7$ | $1 \times 10^7$ | $1 \times 10^7$ | $1 \times 10^7$ |
|  | Major-surface thread. disloc. dens. (cm$^{-2}$) Adjoin.-sub. supra-region | $3 \times 10^7$ | $8 \times 10^7$ | $8 \times 10^7$ | $6 \times 10^7$ | $6 \times 10^7$ | $4 \times 10^7$ | $4 \times 10^7$ |
|  | Carrier concentration (cm$^{-3}$) | $5 \times 10^{18}$ | $5 \times 10^{18}$ | $5 \times 10^{18}$ | $5 \times 10^{18}$ | $5 \times 10^{18}$ | $5 \times 10^{18}$ | $5 \times 10^{18}$ |
|  | Oxygen/cm$^3$ | $4 \times 10^{18}$ | $4 \times 10^{18}$ | $2 \times 10^{17}$ | $3.2 \times 10^{18}$ | $4.9 \times 10^{18}$ | $2 \times 10^{18}$ | $3 \times 10^{18}$ |
|  | Silicon/cm$^3$ | $1 \times 10^{18}$ | $1 \times 10^{18}$ | $4.8 \times 10^{18}$ | $1.8 \times 10^{18}$ | $1 \times 10^{17}$ | $3 \times 10^{18}$ | $2 \times 10^{18}$ |
|  | Principal impurities | O, Si | O, Si | O, Si | O, Si | O, Si | O, Si | O, Si |

|  |  | Emb. 8 | Emb. 9 | Emb. 10 | Emb. 11 | Emb. 12 | Emb. 13 |
| --- | --- | --- | --- | --- | --- | --- | --- |
| III-Nitride crystal substrate | Substrate type | GaN | GaN | GaN | GaN | GaN | GaN |
|  | Major-surface plane orient. | $(12\bar{3}0)$ | $(23\bar{5}0)$ | $(20\bar{2}1)$ | $(20\bar{2}\bar{1})$ | $(22\bar{4}1)$ | $(22\bar{4}\bar{1})$ |
|  | Major-surface roughness Ra (nm) | 5 | 5 | 5 | 5 | 5 | 5 |
|  | Adjoining-surface roughness Ra (nm) | 5 | 5 | 5 | 5 | 5 | 5 |
| III-Nitride crystal | Crystal type | GaN | GaN | GaN | GaN | GaN | GaN |
|  | Crystal growth method | HVPE | Flux | HVPE | HVPE | HVPE | HVPE |
|  | Crystal growth temperature (° C.) | 1050 | 870 | 1050 | 1050 | 1050 | 1050 |
|  | Major-surface plane orient. | $(12\bar{3}0)$ | $(23\bar{5}0)$ | $(20\bar{2}1)$ | $(20\bar{2}\bar{1})$ | $(22\bar{4}1)$ | $(22\bar{4}\bar{1})$ |
|  | Pits present in major surface? | Yes | No | No | No | Yes | Yes |
|  | X-ray diff. peak FWHM (arcsec) Direct-over-subst. region | 280 | 230 | 120 | 90 | 220 | 200 |
|  | X-ray diff. peak FWHM (arcsec) Adjoin.-sub. supra-region | 660 | 490 | 380 | 360 | 580 | 480 |
|  | Major-surface thread. disloc. dens. (cm$^{-2}$) Direct-over-subst. region | $1 \times 10^7$ | $1 \times 10^7$ | $1 \times 10^7$ | $1 \times 10^7$ | $3 \times 10^7$ | $3 \times 10^7$ |
|  | Major-surface thread. disloc. dens. (cm$^{-2}$) Adjoin.-sub. supra-region | $7 \times 10^7$ | $4 \times 10^7$ | $4 \times 10^7$ | $4 \times 10^7$ | $7 \times 10^7$ | $7 \times 10^7$ |
|  | Carrier concentration (cm$^{-3}$) | $4 \times 10^{18}$ | $3 \times 10^{18}$ | $1 \times 10^{18}$ | $1 \times 10^{18}$ | $2 \times 10^{18}$ | $2 \times 10^{18}$ |
|  | Oxygen/cm$^3$ | $2 \times 10^{18}$ | $2.5 \times 10^{18}$ | $7 \times 10^{17}$ | $8 \times 10^{17}$ | $1 \times 10^{18}$ | $1.5 \times 10^{18}$ |
|  | Silicon/cm$^3$ | $2 \times 10^{18}$ | $5 \times 10^{17}$ | $3 \times 10^{17}$ | $2 \times 10^{17}$ | $1 \times 10^{18}$ | $5 \times 10^{17}$ |
|  | Principal impurities | O, Si | O, Si | O, Si | O, Si | O, Si | O, Si |

As is evident from Table I, III-nitride crystal having a {h$_0$k$_0$i$_0$l$_0$} major surface was obtained by a III-nitride crystal manufacturing method including: a step of slicing III-nitride bulk crystal into a plurality of III-nitride crystal substrates having major surfaces of plane orientation {h$_0$k$_0$i$_0$l$_0$} other than {0001}, designated by choice; a step of disposing the plurality of III-nitride crystal substrates adjoining each other sideways so that the major surfaces of the plurality of III-nitride crystal substrates parallel each other and so that the [0001] directions in the substrates be oriented in the same way; and a step of growing III-nitride crystal onto the major surfaces of the plurality of III-nitride crystal substrates.

Herein, as indicated by Embodiments 1 through 13, the fact that {h$_0$k$_0$i$_0$l$_0$} was—that the off-axis angle was—5° or less with respect to any crystallographically equivalent plane orientation selected from the group consisting of {1-10x} (wherein x is a whole number), {11-2y} (wherein y is a whole number), and {hk-(h+k)l} (wherein h, k and l are whole numbers) meant that III-nitride crystal of superior crystallinity, having a {h$_0$k$_0$i$_0$l$_0$} major surface could be obtained. In particular, as indicated by Embodiment 1, the fact that {h$_0$k$_0$i$_0$l$_0$} was {1-100} meant that III-nitride crystal of exceptionally superior crystallinity could be obtained.

Furthermore, as indicated by Embodiments 1 and 2, from the perspective of growing III-nitride crystal stably, it is preferable that the roughness average Ra of the surfaces along which the plurality of III-nitride crystal substrates adjoin be 50 nm or less, more preferably 5 nm or less Embodiment 14

Figure 12:
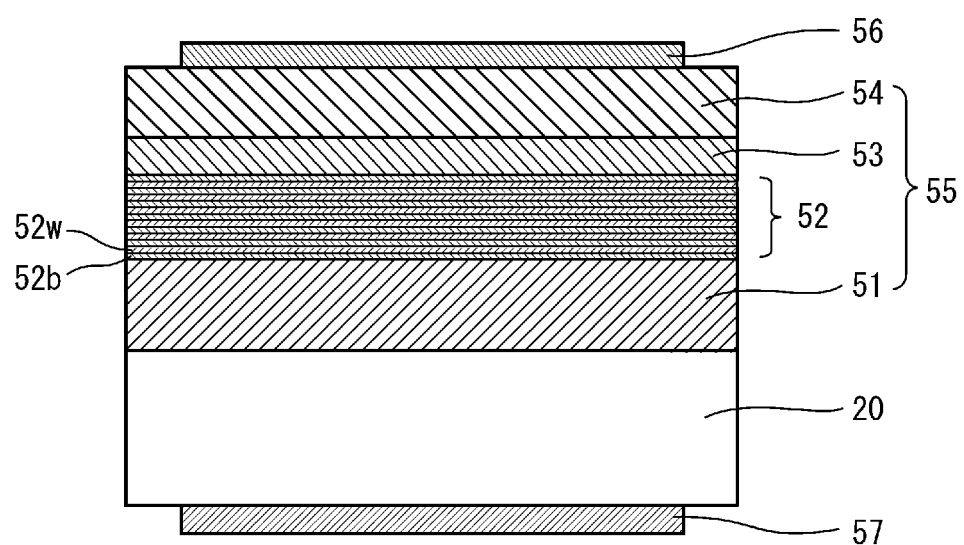
FIG. 12 is a schematic sectional diagram of a light-emitting device manufactured utilizing epitaxial III-nitride crystal involving the present invention.

Crystal of (1-102) orientation, manufactured in Embodiment 4, was processed into a 0.4-mm thick, 2-inch diameter wafer, onto which, referring to FIG. 12, an LED structure 55 was formed by MOCVD to fabricate a light-emitting diode (LED) as a light-emitting semiconductor device. In this instance, for growing the plurality of III-nitride crystal layers that constituted the LED structure, trimethyl gallium (TMG), trimethyl indium (TMI), and/or trimethyl aluminum (TMA) were utilized as the Group-III source material; ammonia was utilized as the nitrogen source material; monosilane was utilized as the n-type dopant source material; and bis(cyclopentadienyl)magnesium (CP2Mg) was utilized as the p-type dopant source material.

Specifically, as the plurality of III-nitride crystal layers constituting the LED structure 55, an n-type GaN layer 51 of 2 μm thickness, a multiquantum well (MQW) light-emitting layer 52 of 88 nm thickness (seven $In_{0.01}GaN$ barrier layers 52b of 10 nm thickness and six $In_{0.14}GaN$ well layers 52w of 3 nm thickness, arranged in alternating layers), a p-type $Al_{0.18}GaN$ electron-blocking layer 53 of 20 nm thickness, and a p-type GaN contact layer 54 of 50 nm thickness were grown, in that order, by MOCVD onto the major surface of a GaN crystal substrate 20, with the (1-102) plane being the major surface.

As a p-side electrode 56, a transparent ohmic contact, constituted from Ni (5 nm)/Au (10 nm) and measuring 400 μm lengthwise×400 μm widthwise×15 nm in thickness, was formed by vacuum evaporation deposition onto the p-type GaN contact layer 54. Then, as an n-side electrode 57, an ohmic contact, constituted from Ti(20 nm)/Al(300 nm) and measuring 400 μm lengthwise×400 μm widthwise×320 nm in thickness, was formed by vacuum evaporation deposition onto the wafer major surface on the reverse side from the MOCVD-growth side. The wafer was then segmented into chips measuring 500 μm lengthwise×500 μm widthwise to complete the LEDs.

The thus obtained LEDs, with emission wavelength of 420 nm and, with an emission intensity of 4 mW to 5 mW when a 20 mA current was applied, demonstrating outstanding light output intensity, were ideally suited to LED applications.

Embodiment 15

Figure 13:
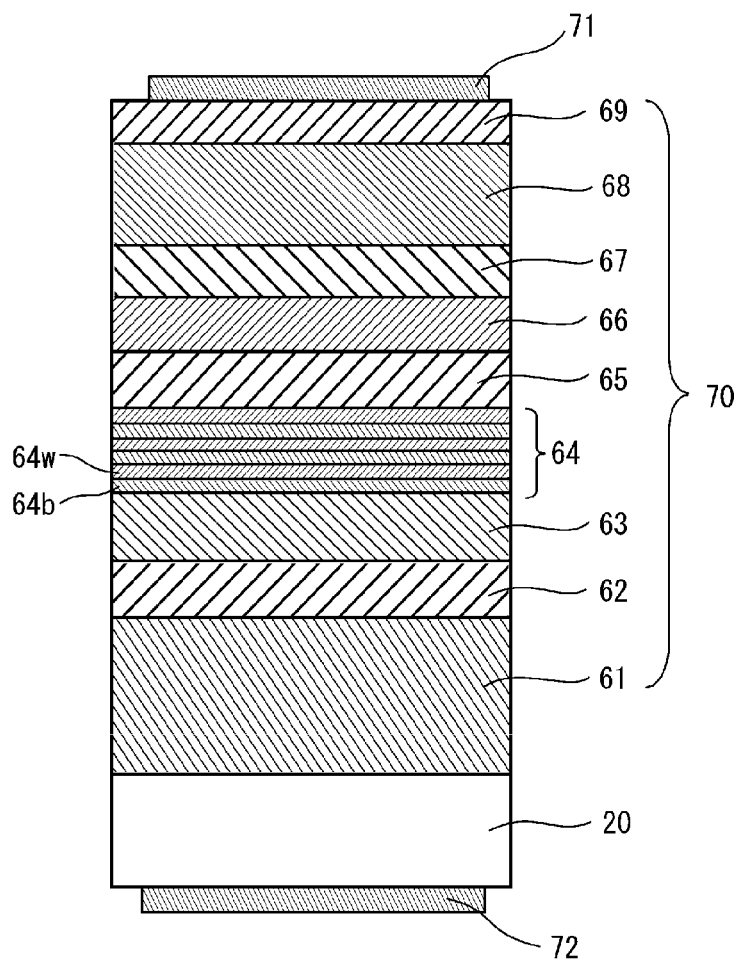
FIG. 13 is a schematic sectional diagram of a light-emitting device manufactured utilizing epitaxial III-nitride crystal involving the present invention.

Crystal of (20-21) orientation, manufactured in Embodiment 10, was processed into a 0.4-mm thick, 2-inch diameter wafer, onto which, referring to FIG. 13, an LD structure 70 was formed by MOCVD to fabricate a laser diode (LD) as a light-emitting semiconductor device. In this instance, for growing the plurality of III-nitride crystal layers that constituted the LD structure, trimethyl gallium (TMG), trimethyl indium (TMI), and/or trimethyl aluminum (TMA) were utilized as the Group-III source material; ammonia was utilized as the nitrogen source material; monosilane was utilized as the n-type dopant source material; and bis(cyclopentadienyl) magnesium (CP2Mg) was utilized as the p-type dopant source material.

Specifically, as the plurality of III-nitride crystal layers constituting the LD structure 70, an n-type $Al_{0.04}GaN$ layer 61 of 2 μm thickness, an n-type GaN layer 62 of 50 nm thickness, an undoped $In_{0.03}GaN$ layer 63 of 65 nm thickness, a multiquantum well (MQW) light-emitting layer 64 (three $In_{0.02}GaN$ barrier layers 64b of 15 nm thickness and three $In_{0.30}GaN$ well layers 64w of 3 nm thickness, arranged in alternating layers), an undoped $In_{0.03}GaN$ layer 65 of 50 nm thickness, an undoped GaN layer 66 of 50 nm thickness, a p-type $Al_{0.18}GaN$ layer 67 of 20 nm thickness, a p-type $Al_{0.06}GaN$ layer 68 of 400 nm thickness, and a p-type GaN contact layer 69 of 50 nm thickness were grown, in that order, by MOCVD onto the major surface of a GaN crystal substrate 20, with the (20-21) plane being the major surface.

As a p-side electrode 71, an ohmic contact, constituted from Ni (20 nm)/Au (200 nm) and measuring 10 μm lengthwise×400 μm widthwise×220 nm in thickness, was formed by vacuum evaporation deposition onto the p-type GaN contact layer 69. Then, as an n-side electrode 72, an ohmic contact, constituted from Ti (20 nm)/Al (300 nm) and measuring 400 μm lengthwise×400 μm widthwise×320 nm in thickness, was formed by vacuum evaporation deposition onto the wafer major surface on the reverse side from the MOCVD-growth side. The wafer was then cleaved along the (1-120) plane into chips measuring 300 μm lengthwise×400 μm widthwise to complete the LDs.

The thus obtained LDs, demonstrating, with a lasing threshold current of 420 mA and a lasing wavelength of 520 nm, outstanding device properties, were optimal as green LDs.

Embodiment 16

Figure 14:
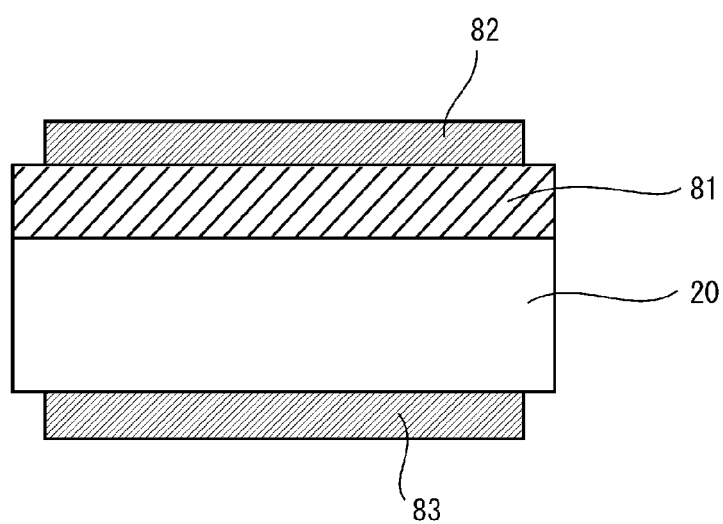
FIG. 14 is a schematic sectional diagram of an electronic device manufactured utilizing epitaxial III-nitride crystal involving the present invention.

Crystal of (11-20) orientation, manufactured in Embodiment 3, was processed into a 0.4-mm thick, 2-inch diameter wafer, onto which, referring to FIG. 14, a Schottky barrier diode structure was formed by MOCVD to fabricate a Schottky barrier diode (SBD) as a semiconductor electronic device. In this instance, for growing the III-nitride crystal layer that constituted the SBD structure, trimethyl gallium (TMG), was utilized as the Group-III source material, ammonia as the nitrogen source material, while monosilane was utilized as the n-type dopant source material.

Specifically, as the III-nitride crystal layer constituting the SBD structure, an n-type GaN layer 81 of 10 μm thickness was grown by MOCVD onto the major surface of a GaN crystal substrate 20, with the (11-20) plane being the major surface.

As a p-side electrode 82, a Schottky contact, constituted from Ni (20 nm)/Au (200 nm) and measuring 400 μm lengthwise×400 μm widthwise×220 nm in thickness, was formed by vacuum evaporation deposition onto the surface of the epitaxial layer that had been deposited by MOCVD. In turn, as an n-side electrode 83, an ohmic contact, constituted from Ti (20 nm)/Al (300 nm) and measuring 400 μm lengthwise×400 μm widthwise×320 nm in thickness, was formed by vacuum evaporation deposition onto the wafer major surface on the reverse side from the MOCVD-growth side. The wafer was then segmented into chips measuring 5 mm lengthwise×5 mm widthwise to complete fifty-two SBDs.

The blocking voltage of the obtained fifty-two SBDs was measured, whereupon the maximum was 1500 V and the minimum was 680 V, with the average being 1020 V. In addition, with a 50-amp on-resistance being a minimum 0.6 $m\Omega\text{-}cm^2$ and a maximum 3 $m\Omega\text{-}cm^2$ with the average being 0.8 $m\Omega\text{-}cm^2$, the devices had outstanding characteristics and thus were ideally suited as Schottky barrier diodes.

III-Nitride Bulk Crystal Preparation 2

AlN bulk crystal, as III-nitride bulk crystal utilized in a III-nitride crystal manufacturing method involving the present invention, was manufactured by a method as below.

To begin with, AlN bulk crystal was deposited by sublimation growth onto the (0001)-plane major surface of, as an undersubstrate, an SiC substrate of 51 mm diameter and 0.5 mm thickness. During the growth of the AlN bulk crystal, until it had grown to 0.5 mm thickness, 0.1 mass % $CO_2$ gas (Group-IV element-containing gas) was supplied, with the growth temperature made 1700° C., to dope the crystal with carbon atoms as Group IV dopants. Thereafter, while a growth temperature of 1800° C. was sustained, the supply of the Group-IV element-containing gas was stopped, and an AlN bulk crystal of 5.5 mm thickness (including the just-noted 0.5-mm thick portion doped with carbon atoms) was grown. On the (0001) face of the grown AlN bulk crystal, a plurality of hexagonal pyramidal pits defined by plural facets was formed.

Next, employing a mechanical polish, the SiC substrate was removed from the above-described AlN bulk crystal, yielding a 50-mm diameter, 3-mm thick AlN bulk crystal as III-nitride bulk crystal. At that time, the portion doped with Group IV dopants (carbon atoms) by supplying a Group-IV element containing gas, and grown 5 mm thick, was eliminated.

Embodiment 17

To begin with, referring to FIG. 3A, the (0001) face and (000-1) face—the two major surfaces—of AlN bulk crystal (III-nitride bulk crystal 1) were ground and polished to bring the roughness average Ra of either major surface to 5 nm.

Next, again referring to FIG. 3A: The AlN bulk crystal whose roughness average Ra on either of its major surfaces had been made 5 nm was sawed along a plurality of planes perpendicular to a <1-100> direction to slice off a plurality of AlN crystal substrates (III-nitride crystal substrates 10$p$, 10$q$) whose width S was 3 mm, length L was 20 to 50 mm, and thickness T was 1 mm, having {1-100} major surfaces. Subsequently, the not-ground and not-polished four sides of each sliced-off AlN crystal substrate were ground and polished, to bring the roughness average Ra of the four surfaces to 5 nm. A plurality of AlN crystal substrates whose roughness average Ra on the {1-100} major surfaces was 5 nm was thus obtained. Among these AlN crystal substrates were AlN crystal substrates whose major-surface plane orientation did not coincide perfectly with {1-100}, but the plane orientation of the major surface of such AlN crystal substrates in all cases was misoriented by 5° or less with respect to {1-100}.

Next, referring to FIG. 3B, these AlN crystal substrates were disposed adjoining each other sideways, in a manner such that the (1-100) major surfaces 10$pm$, 10$qm$ of the plurality of AlN crystal substrates (III-nitride crystal substrates 10$p$, 10$q$) would be parallel to each other, and such that the [0001] directions in the AlN crystal substrates would be oriented in the same way. In this instance, referring also to FIG. 3C, the roughness average Ra of the adjoining faces 10$pt$, 10$qt$ of the plurality of AlN crystal substrates was 5 nm.

Next, with reference again to FIG. 3C, under a gaseous nitrogen ambient at 2200° C. AlN crystal (III-nitride crystal 20) was deposited by sublimation growth onto the (1-100) major surfaces 10$pm$, 10$qm$ of the situated plurality of AlN crystal substrates (III-nitride crystal substrates 10$p$, 10$q$) for 50 hours at a deposition rate of 100 μm/hr.

The obtained AlN crystal (III-nitride crystal 20), free of abnormal growth even in the adjoining-substrate supra-regions 20$t$, had a (1-100) major surface 20$m$. The crystallinity of the AlN crystal (III-nitride crystal 20) was characterized by an x-ray diffraction rocking-curve analysis of the (1-100) plane. With this AlN crystal, the direct-over-substrate regions 20$s$ demonstrated diffraction peaks undivided in the tip, with the full-width at half-maximum being 30 arcsec. Likewise, in the adjoining-substrate supra-regions 20$t$ as well, diffraction peaks without divisions in the tip were demonstrated, with the full-width at half-maximum being 50 arcsec.

Figure 3C:
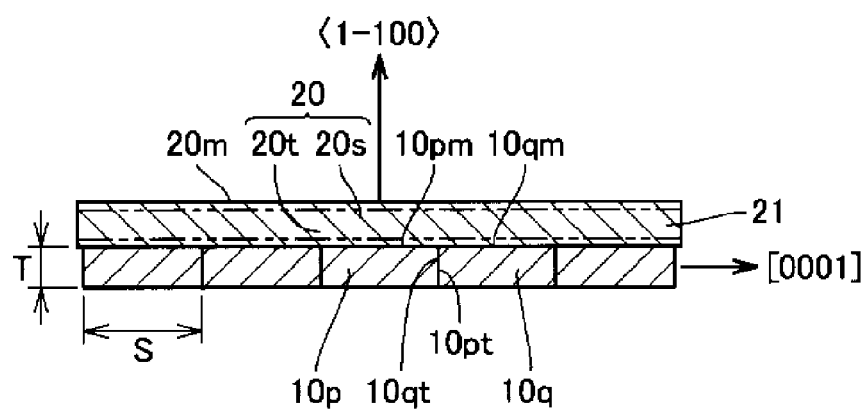
FIG. 3C, a schematic diagram for illustrating one example of a III-nitride crystal manufacturing method involving the present invention, is a sectional view summarily representing a crystal-growth process step.

Furthermore, in the following manner the threading dislocation density in the (1-100) major surface 20$m$ of the AlN crystal was determined. Namely, an AlN wafer (III-nitride crystal wafer 21), as represented in FIG. 3C, characterized by an area where the (1-100) plane was broadest was sliced off. This AlN wafer (III-nitride crystal wafer 21) was heated to 250° C., and the (1-100) major surface was etched by immersion of the wafer for one hour in a molten KOH—NaOH liquefied mixture (in mass ratio, KOH:NaOH=50:50). By observation of the (1-100) major surface of the etched AlN wafer (III-nitride crystal wafer 21) under an optical microscope, the number of etch pits within a 100 μm×100 μm square surface was counted to calculate the etch-pit density (EPD) as the major-surface threading dislocation density.

The threading dislocation density of the (1-100) major surface 20$m$ of the above-described AlN crystal was $1\times10^5$ cm$^{-2}$ in the direct-over-substrate region 20$s$, and $2\times10^5$ cm$^{-2}$ in the adjoining-substrate supra-regions 20$t$. Meanwhile, the principal impurities in the AlN crystal according to SIMS (secondary ion mass spectrometry) were oxygen atoms and carbon atoms. The results are tabulated in Table II.

It should be understood that in Embodiment 17, the major-surface plane orientations of the plurality of AlN crystal substrates that were the surfaces onto which the AlN crystal was grown were all (1-100), in that although a few or more might have been (-1100), the crystallographic equivalent of (1-100), they would lead to the same results.

Embodiment 18

To begin with, referring to FIG. 3A, the (0001) face and (000-1) face—the two major surfaces—of AlN bulk crystal were ground and polished to bring the roughness average Ra of either major surface to 50 nm.

Next, again referring to FIG. 3A: The AlN bulk crystal whose roughness average Ra on either of its major surfaces had been made 50 nm was sawed along a plurality of planes perpendicular to a <1-100> direction to slice off a plurality of AlN crystal substrates (III-nitride crystal substrates 10$p$, 10$q$) whose width S was 3 mm, length L was 20 to 50 mm, and thickness T was 1 mm, having {1-100} major surfaces. Subsequently, the not-ground and not-polished four sides of each sliced-off AlN crystal substrate were ground and polished, to bring the roughness average Ra of the four surfaces to 5 nm. A plurality of AlN crystal substrates whose roughness average Ra on the {1-100} major surfaces was 5 nm was thus obtained. Among these AlN crystal substrates were AlN crystal substrates whose major-surface plane orientation did not coincide perfectly with {1-100}, but the plane orientation of the major surface of such AlN crystal substrates in all cases was misoriented by 5° or less with respect to {1-100}.

Next, referring to FIG. 3B, these AlN crystal substrates were disposed adjoining each other sideways, in a manner such that the (1-100) major surfaces 10$pm$, 10$qm$ of the plurality of AlN crystal substrates (III-nitride crystal substrates 10$p$, 10$q$) would be parallel to each other, and such that the [0001] directions in the AlN crystal substrates would be oriented in the same way. In this instance, referring also to FIG. 3C, the roughness average Ra of the adjoining faces 10$pt$, 10$qt$ of the plurality of AlN crystal substrates was 50 nm.

Next, with reference again to FIG. 3C, under a gaseous nitrogen ambient at 2200° C. AlN crystal (III-nitride crystal 20) was deposited by sublimation growth onto the (1-100) major surfaces 10$pm$, 10$qm$ of the situated plurality of AlN crystal substrates (III-nitride crystal substrates 10$p$, 10$q$) for 50 hours at a deposition rate of 100 μm/hr.

The obtained AlN crystal (III-nitride crystal 20), free of abnormal growth even in the adjoining-substrate supra-regions 20$t$, had a (1-100) major surface 20$m$. In an x-ray diffraction rocking-curve analysis of the (1-100) plane of the AlN crystal, the direct-over-substrate regions 20$s$ demonstrated diffraction peaks undivided in the tip, with the full-width at half-maximum being 100 arcsec. Likewise, in the adjoining-substrate supra-regions 20$t$ as well, diffraction peaks without divisions in the tip were demonstrated, with the full-width at half-maximum being 150 arcsec. Furthermore, the threading dislocation density of the (1-100) major surface 20$m$ of the AlN crystal was $3\times10^5$ cm$^{-2}$ in the direct-over-substrate region 20$s$, and $4\times10^5$ cm$^{-2}$ in the adjoining-substrate supra-regions 20$t$. Meanwhile, the principal impurities in the AlN crystal were oxygen atoms and carbon atoms. The results are tabulated in Table II.

It should be understood that in Embodiment 18, the major-surface plane orientations of the plurality of AlN crystal substrates that were the surfaces onto which the AlN crystal was grown were all (1-100), in that although a few or more might have been (−1100), the crystallographic equivalent of (1-100), they would lead to the same results.

TABLE II

| | | Emb. 17 | Emb. 18 |
|---|---|---|---|
| III-Nitride crystal substrate | Substrate type | AlN | AlN |
| | Major-surface plane orientation | (1$\bar{1}$00) | (1$\bar{1}$00) |
| | Major-surface roughness Ra (nm) | 5 | 5 |
| | Adjoining-surface roughness Ra (nm) | 5 | 50 |
| III-Nitride crystal | Crystal type | AlN | AlN |
| | Crystal growth method | Sublimation | Sublimation |
| | Crystal growth temperature (° C.) | 2200 | 2200 |
| | Major-surface plane orientation | (1$\bar{1}$00) | (1$\bar{1}$00) |
| | Pits present in major surface? | No | No |
| | X-ray diffraction peak FWHM (arcsec) | Direct-over-substrate region | 30 | 100 |
| | | Adjoining-substrate supra-region | 50 | 150 |
| | Major-surface threading dislocation density (cm$^{-2}$) | Direct-over-substrate region | $1 \times 10^5$ | $3 \times 10^5$ |
| | | Adjoining-substrate supra-region | $2 \times 10^5$ | $4 \times 10^5$ |
| | Carrier concentration (cm$^{-3}$) | — | — |
| | Principal impurities | O, C | O, C |

As is evident from Table II, III-nitride crystal having a $\{h_0k_0i_0l_0\}$ major surface was obtained by a III-nitride crystal manufacturing method including: a step of slicing III-nitride bulk crystal into a plurality of III-nitride crystal substrates having major surfaces of plane orientation $\{h_0k_0i_0l_0\}$ other than {0001}, designated by choice; a step of disposing the substrates adjoining each other sideways so that the major surfaces of the plurality of III-nitride crystal substrates parallel each other and so that the [0001] directions in the substrates be oriented in the same way; and a step of growing III-nitride crystal onto the major surfaces of the plurality of III-nitride crystal substrates.

Herein, as is evident from a comparison between Embodiments 1 through 7 in Table I and Embodiments 17 and 18 in Table II, it was found that in the III-nitride crystal manufacturing methods, having the temperature at which the III-nitride crystal is grown be 2000° C. or greater remarkably reduces the threading dislocation density in the major surface of the III-nitride crystal.

The presently disclosed embodying modes and embodiment examples should in all respects be considered to be illustrative and not limiting. The scope of the present invention is set forth not by the foregoing description but by the scope of the patent claims, and is intended to include meanings equivalent to the scope of the patent claims and all modifications within the scope.

Group III-nitride crystal manufactured by a manufacturing method involving the present invention is utilized in applications including optical elements (such as light-emitting diodes and laser diodes), in semiconductor electronic devices (such as rectifiers, bipolar transistors, field-effect transistors, or high electron mobility transistors (HEMTs)), semiconductor sensors (such as temperature sensors, pressure sensors, radiation sensors, or visible-blind ultraviolet detectors), surface acoustic wave devices (SAW devices), acceleration sensors, microelectromechanical system (MEMS) parts, piezoelectric oscillators, resonators, and piezoelectric actuators.

What is claimed is:

1. A method of manufacturing III-nitride crystal having a major surface of plane orientation other than {0001}, designated by choice, the III-nitride crystal manufacturing method including:
   a step of slicing III-nitride bulk crystal through a plurality of planes defining a predetermined slice thickness in the direction of the designated plane orientation, to produce a plurality of III-nitride crystal substrates having a major surface of the designated plane orientation;
   a step of disposing the substrates adjoining each other sideways in a manner such that the major surfaces of the substrates parallel each other and such that any difference in slice thickness between two adjoining III-nitride crystal substrates is not greater than 0.1 mm; and
   a step of growing III-nitride crystal onto the major surfaces of the substrates.

2. A III-nitride crystal manufacturing method as set forth in claim 1, wherein the designated plane orientation is misoriented by an off angle of 5° or less with respect to any crystallographically equivalent plane orientation selected from the group consisting of {1-10x} (wherein x is a whole number), {11-2y} (wherein y is a whole number), and {hk-(h+k)l} (wherein h, k and l are whole numbers).

3. A III-nitride crystal manufacturing method as set forth in claim 1, wherein the designated plane orientation is misoriented by an off angle of 5° or less with respect to {1-100} plane orientations.

4. A III-nitride crystal manufacturing method as set forth in claim 1, wherein the designated plane orientation is misoriented by an off angle of 5° or less with respect to any crystallographically equivalent plane orientation selected from the group consisting of {11-20}, {1-10±2}, {11-2±2}, {20-2±1} and {22-4±1}.

5. A III-nitride crystal manufacturing method as set forth in claim 1, wherein the roughness average Ra of the faces along which the substrates adjoin each other is 50 nm or less.

6. A III-nitride crystal manufacturing method as set forth in claim 1, further comprising a step of grinding/polishing the plurality of III-nitride crystal substrates such that the surface roughness of the substrate major surfaces is not greater than 50 nm.

* * * * *